United States Patent
Epstein et al.

(10) Patent No.: US 7,309,986 B2
(45) Date of Patent: Dec. 18, 2007

(54) METHODS AND APPARATUS FOR MAGNETIC RESONANCE IMAGING IN INHOMOGENEOUS FIELDS

(75) Inventors: Charles L. Epstein, Philadelphia, PA (US); Jeremy Magland, Lansdale, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 11/385,338

(22) Filed: Mar. 21, 2006

(65) Prior Publication Data

US 2006/0226837 A1    Oct. 12, 2006

Related U.S. Application Data

(60) Provisional application No. 60/663,937, filed on Mar. 21, 2005, provisional application No. 60/737,283, filed on Nov. 16, 2005.

(51) Int. Cl.
*G01V 3/00* (2006.01)
(52) U.S. Cl. ..................................... 324/309
(58) Field of Classification Search ........ 324/300–322; 600/410–435
See application file for complete search history.

(56) References Cited

U.S. PATENT DOCUMENTS

| | | | |
|---|---|---|---|
| 4,354,499 A | 10/1982 | Damadian .................... | 600/410 |
| 4,656,425 A | 4/1987 | Bendel ........................ | 324/309 |
| 5,023,554 A | 6/1991 | Cho et al. .................... | 324/309 |
| 5,157,330 A * | 10/1992 | Kaufman et al. ........... | 324/320 |
| 5,304,930 A | 4/1994 | Crowley et al. ............. | 324/309 |
| 5,493,225 A | 2/1996 | Crowley et al. ............. | 324/309 |
| 5,744,960 A | 4/1998 | Pulyer ......................... | 324/320 |
| 6,002,255 A | 12/1999 | Pulyer ......................... | 324/320 |
| 6,127,826 A * | 10/2000 | Thompson et al. ......... | 324/307 |
| 6,489,767 B1 | 12/2002 | Prado et al. ................. | 324/318 |
| 6,700,372 B2 | 3/2004 | Blumich et al. ............. | 324/307 |
| 6,856,132 B2 * | 2/2005 | Appel et al. ................. | 324/303 |
| 2002/0079891 A1 | 6/2002 | Blumich et al. ............. | 324/307 |

(Continued)

OTHER PUBLICATIONS

Ardelean, I. et al., "The nutation spin echo and its use for localized NMR," Jour. Of Magnetic Resonance, 2000, 146, 43-48.

(Continued)

*Primary Examiner*—Diego Gutierrez
*Assistant Examiner*—Dixomara Vargas
(74) *Attorney, Agent, or Firm*—Woodcock Washburn LLP

(57) ABSTRACT

Methods for providing practical magnetic resonance imaging systems that utilize non-homogeneous background fields, $B_0$, as well as, possibly non-linear, gradient fields $G_1$, $G_2$ to make non-invasive measurements to determine, among other things, a spin density function. Two types of non-homogeneous background fields are considered: background fields $B_0$ in which the function $|B_0|$ does not have a critical point within the field of view, and background fields $B_0$ such that the function $|B_0|$ has a single critical point within the field of view. In the first case, an MR-imaging device may be constructed by using the permanent gradient in the background field, $B_0$, as a slice select gradient, so long as particular criteria are met. In the second case, magnets may be constructed so that $|B_0|$ has an isolated non-zero local minimum. Using selective excitation, one can excite only the spins lying in a small neighborhood of this local minimum.

10 Claims, 13 Drawing Sheets

U.S. PATENT DOCUMENTS

| | | | |
|---|---|---|---|
| 2002/0084783 A1 | 7/2002 | Blumich et al. | 324/322 |
| 2002/0089330 A1 | 7/2002 | Blumich et al. | 324/322 |
| 2004/0032258 A1 | 2/2004 | Blumich et al. | 324/303 |
| 2004/0090230 A1 | 5/2004 | Appel et al. | 324/307 |

OTHER PUBLICATIONS

Balcom, B.J., et al., "Single-point ramped imaging with $T_1$ enhancement (SPRITE)," J. Mag. Res. A., 1996, 123, 131-134.

Blümich, B. et al., "The NMR-mouse: construction, excitation, and applications," Magn Reson Imaging, 1998, 16(5/6), 479-484.

Feig, E. et al., "Magnetic resonance imaging with non-uniform fields," Phys. Med. Biol., 1986, 31(10), 1091-1099.

Hoult, D. et al., "The sensitivity of the zeugmatographic experiment involving human samples," J. Mang. Reson., 1979, 34, 425-433.

Hoult, D., "Sensitivity and power deposition in high field imaging experiment," J. Magn. Reson. Imaging, 2000, 12, 46-67.

Kleinberg, R.L. et al., "Novel NMR apparatus for investigating an external sample," Jour. Of Magnetic Resonance, 1992, 97, 466-485.

Lai, C., "Reconstructing NMR images under magnetic fields with large inhomogeneities," J. Phys. E. Sci. Instrum., 1982, 15, 1093-1100.

McIntyre, D.J.O., et al., "SPARE- A robust method for magnetic resonance imaging in inhomogeneous fields," J. of Magnetic Resonance, 130, 1998, 58-62.

Meriles, C.A., et al., "Approach to high resolution ex-situ NMR spectroscopy," Science, 2001, 293, 82-85.

Nam, H., et al., "Magnetic Resonance Imaging with Inhomogeneous Background Fields—Pipe-Dream or real Possibility?" no date available, 1-13.

Sekihara, K. et al., "Image restoration from non-uniform magnetic fields influence for direct Foier NMR imaging," Phys. Med. Biol., 1984, 29, 15-24.

Wu, E.X. et al., "A new 3D localization technique using quadratic field gradients," Magn. Reson. Med., 1994, 32, 242-245.

* cited by examiner

METHODS AND APPARATUS FOR MAGNETIC RESONANCE IMAGING IN INHOMOGENEOUS FIELDS

CROSS-REFERENCE TO RELATED APPLICATIONS

This application claims benefit to U.S. Provisional Application Nos. 60/663,937 filed Mar. 21, 2005 and 60/737,283 filed Nov. 16, 2005.

GOVERNMENT SUPPORT

The present invention was supported by the National Science Foundation under Grant Nos. NSF DMS99-70487, DMS02-07123, and DMS02-3705. The government may have certain rights in the invention.

FIELD OF THE INVENTION

The present invention relates to methods and apparatus for obtaining magnetic resonance images in inhomogeneous magnetic fields and, more particularly, to imaging with a background field $B_0$ that varies both in magnitude and direction, both with and without critical points.

BACKGROUND OF THE INVENTION

In the standard approach to magnetic resonance imaging one uses a strong background field that is as homogeneous as possible. Commercial MR imaging magnets are homogeneous, within the field of view, to about 1 ppm. In "open" MRI systems, the field homogeneity is somewhat less, but still in this general range. One can imagine a variety of situations where it might be useful to do magnetic resonance imaging with the object placed entirely outside the magnet's bore. As a consequence of Runge's Theorem, it is possible to design coils so that this external field is as homogeneous as one would like, in a given region of space. However, this requires a large expenditure of power and complicated, difficult to design arrangements of coils. On the other hand, with simpler arrangements of permanent magnets or electromagnets, one can produce a field, $B_0$, such that, in a given region of space, exterior to the magnets, or coils: (1) The field is strong; (2) The direction of $B_0$ varies in a small solid angle; (3) The level sets of $|B_0|$ are smooth; and (4) The size of $\nabla|B_0|$ is not too large.

Several groups have considered problems of this sort. Generally speaking, the prior art uses pulsed gradients for spatial encoding, and refocusing pulses to repeatedly refocus the accumulating phase in the direction of the permanent gradient. These ideas are described in U.S. Pat. No. 4,656,425 to Bendel, as well as in U.S. Pat. No. 5,023,554 to Cho and Wong. The idea is further developed by Crowley and Rose as described in U.S. Pat. No. 5,304,930 and U.S. Pat. No. 5,493,225. Pulsed gradients are also used in SPRITE, though for different reasons, as noted by Balcom et al., *Single-point ramped imaging with $T_1$ enhancement (SPRITE)*, J. Mag. Res. A, Vol. 123 (1996), pp. 131-134.

Another group considering such problems is that of Dr. Alexander Pines at University of California at Berkeley. His work is described in the recent PNAS paper: "Three-dimensional phase-encoded chemical shift MRI in the presence of inhomogeneous fields" by Vasiliki Demas, Dimitris Sakellariou, Carlos A. Meriles, Songi Han, Jeffrey Reimer, and Alexander Pines. Their approach is somewhat different in that they try to match inhomogeneities in the $B_1$-field with that in the $B_0$-field in order to effectively "cancel" them out. Their efforts are more directed towards spectroscopy and they consider very small field gradients.

Still another group working on problems of this sort is that of Bernhard Blümich at RWTH Aachen in Aachen, Germany. This group's work is described in "The NMR-mouse: construction, excitation, and applications" by Blümich B, Blumler P, Eidmann G, Guthausen A, Haken R, Schmitz U, Saito K, and Zimmer G in Magn Reson Imaging. 1998, pgs 479-484. Their approach is again different from what is described herein in that it uses a stroboscopic acquisition technique. Though it is very good for spectroscopy of materials, it is too time consuming and SAR intensive for in vivo applications.

The present invention addresses methods and apparatus for imaging in such a field as described in a paper by one of the present inventors (C L Epstein) entitled "Magnetic Resonance Imaging in Inhomogeneous Fields," Inverse Problems, Vol. 20, pages 753-780 (Mar. 19, 2004), the contents of which are hereby incorporated by reference in their entirety. Further refinements of this method are presented herein for acquiring data that lead to a fairly standard 2d-reconstruction problem.

SUMMARY OF THE INVENTION

Methods are described for providing practical magnetic resonance imaging systems that utilize non-homogeneous background fields, $B_0$, as well as possibly non-linear basic gradient fields $G_1$, $G_2$ to make non-invasive measurements to determine, among other things, a spin density function. Generally, two types of non-homogeneous background fields are considered:

a. Background fields $B_0$ in which the function $|B_0|$ does not have a critical point within the field of view.

b. Background fields $B_0$ such that the function $|B_0|$ has a single critical point within the field of view.

In the case of background fields $B_0$ without a critical point in the field of view, an MR-imaging device may be constructed by using the permanent gradient in the background field, $B_0$, as a slice select gradient, so long as:

a. the direction (as opposed to magnitude) of the background field does not vary too much within the field of view;

b. the strength of the background field remains large throughout the field of view so that the local Larmor frequency may be determined to a high degree of accuracy by the components of the various fields parallel to $B_0$;

c. the level sets of the function $|B_0|$ within the field of view are expressible as graphs of smooth functions over a region lying in a plane;

d. apparatus can be constructed to generate magnetic fields $G_1$, $G_2$ so that the functions $|B_0|$, $<B_0, G_1>$, $<B_0, G_2>$ define coordinates within the field of view;

e. for parameters $(\eta_1, \eta_2)$ lying in a certain range, apparatus is available to generate the fields $\eta_1 G_1 + \eta_2 G_2$; and f. apparatus is available for generating sufficiently homogeneous RF-fields within the field of view.

The methods of the invention demonstrate that there are many practical circumstances where these criteria can all be met. An apparatus meeting such criteria can allow one to make non-invasive measurements that allow a reconstruction of the spin density function determined by a 3-dimensional object. The measurement process using such an apparatus in accordance with the invention includes the following steps:

placing the object to be imaged in an inhomogeneous background field $B_0$ for a sufficient time for the nuclear spins of a desired species to be polarized;

selectively exciting the polarized nuclear spins using standard selective excitation RF-pulse sequences from apparatus that generates substantially homogeneous RF-fields within a field of view of the apparatus; and spatially encoding phases of the excited nuclear spins using gradient fields $G_1$, $G_2$, wherein the functions $|B_0|$, $<B_0, G_1>$, $<B_0, G_2>$ define coordinates within the field of view of the apparatus.

In exemplary implementations, a single refocusing pulse may be used to describe both a pure frequency encoding scheme as well as a combined phase encoding and frequency encoding scheme. In an exemplary embodiment, the measurement process employs a 3-dimensional encoding scheme wherein a complete line in 3-dimensional k-space is read after each excitation and refocusing pulse.

In other exemplary implementations, the method includes the steps of selecting a 2-dimensional slice of the object for excitation that is not perpendicular to $G_0$, exciting the 2-dimensional slice of the object by applying a selective RF-pulse in the presence of a slice excitation gradient $G_{ss}$, where $G_{ss}$ is a linear combination of $G_0$ and a transverse gradient $G_{ss}^{app}$, generated as a linear combination of basic gradient fields $G_1$, $G_2$ provided by a magnetic resonance scanner, and applying a readout gradient $G_{re}$ where $G_{re}$ is a linear combination of $G_0$ and a transverse gradient $G_{re}^{app}$ generated as a linear combination of $G_1$, $G_2$, where $G_{ss}$ and $G_{re}$ are not parallel at any point in the selected excited slice. The selected excited slice of the object may then be reconstructed and displayed in a conventional manner. The selected excited slice may also be phase encoded with a gradient $G_{ph}$ generated as a linear combination of $G_1$, $G_2$. The functions $X=<G_1, B_0>$, $Y=<G_2, B_0>$ and $Z=|B_0(x,y,z)|$, may define local coordinates that map the field of view of the magnetic resonance scanner onto a region of space, whereby $G_{ss}=B_0+G_1$ and $G_{re}=B_0-G_1$. The step of applying the readout gradient $G_{re}$ may also include the step of applying at least one refocusing pulse.

Since the spatially encoded signal may be interpreted as samples of the Fourier transform of a function of three physical variables, an image reconstruction function can be recovered using standard Fourier inversion methods. The methodology of the invention set forth herein indicates that there is no difficulty, in principle, in obtaining a sufficiently large signal to acquire useful measurements, even in the presence of a permanent gradient in the $B_0$ field.

The selective excitation function may be shown to be the result of applying a coordinate change to the spin density function and multiplying this function by a positive function. The change of coordinates and positive multiplier can both be determined by standard computations from the known information $|B_0|$, $<G_1,B_0>$, $<G_2,B_0>$. This data is determined by the physical apparatus and, given that the hardware remains in calibration, need only be computed once and stored. With this information, and the image reconstruction function, the desired spin density function can be reconstructed.

On the other hand, in the case of background fields $B_0$ with a single critical point in the field of view, the method of the invention describes how magnets may be constructed so that $|B_0|$ has an isolated non-zero local minimum. Using selective excitation, one can excite only the spins lying in a small neighborhood of this local minimum. In this way one can do spatially localized, high SNR, spectroscopic measurements, without any need for further spatial encoding.

BRIEF DESCRIPTION OF THE DRAWINGS

The systems and methods for generating magnetic resonance images in inhomogeneous fields in accordance with the present invention are further described with reference to the accompanying drawings, in which:

FIG. 2 illustrates the properties of the magnetic field generated by the arrangement of conductors shown in FIG. 1, where the current on the inner cylinder is 0.6 units and the current on the outer cylinder is 2 units. FIG. 2(a) illustrates level contours of $|B_0|$ and field vectors (the essentially vertical lines), while

The geometric distortion due to the slant of the read-out gradient is not corrected in these images.

Figure 12:
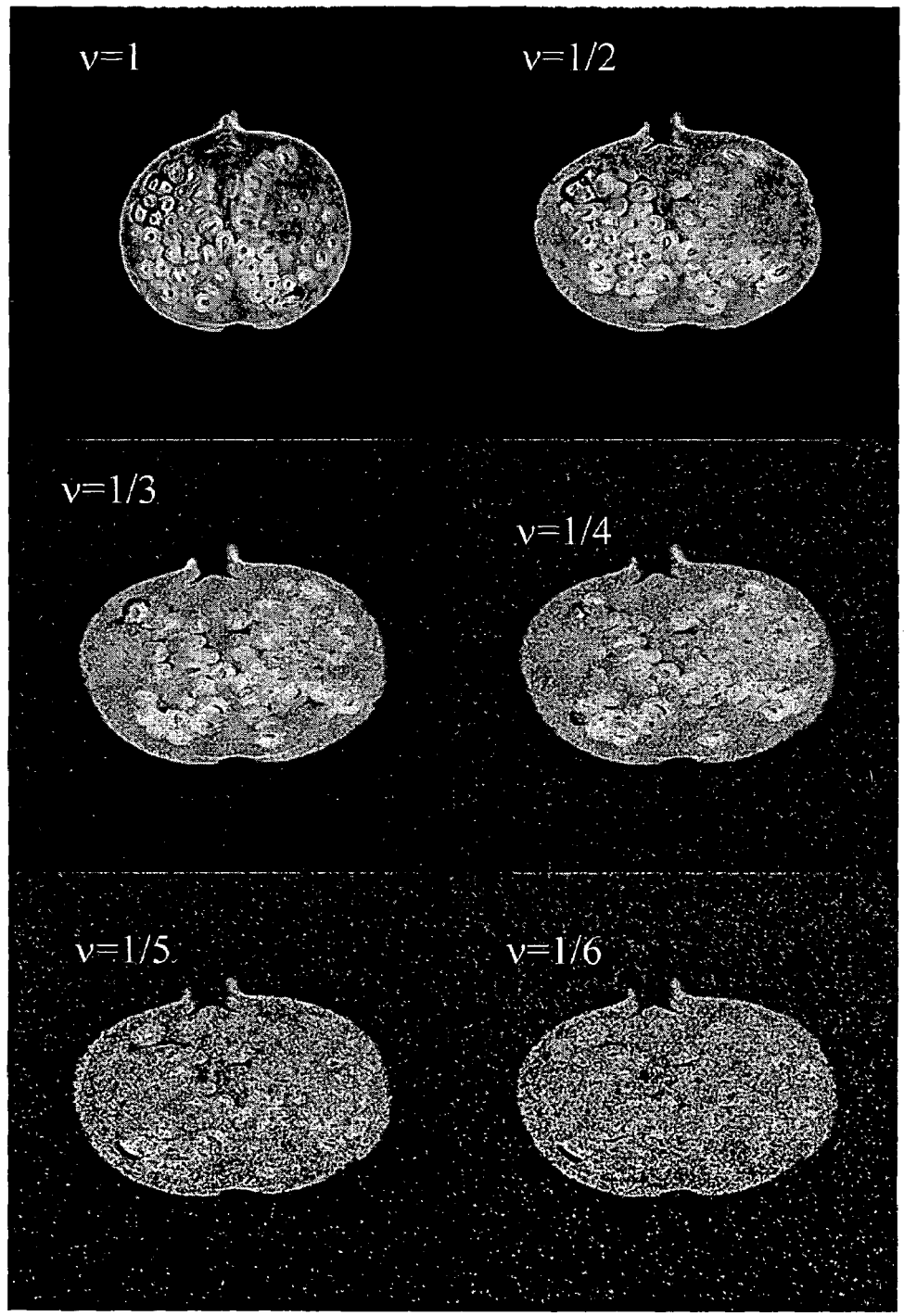
FIG. 12 shows images made using the slant-slice protocol with various values of the ratio $$v = \frac{g_x}{g_z}.$$
Figure 13:
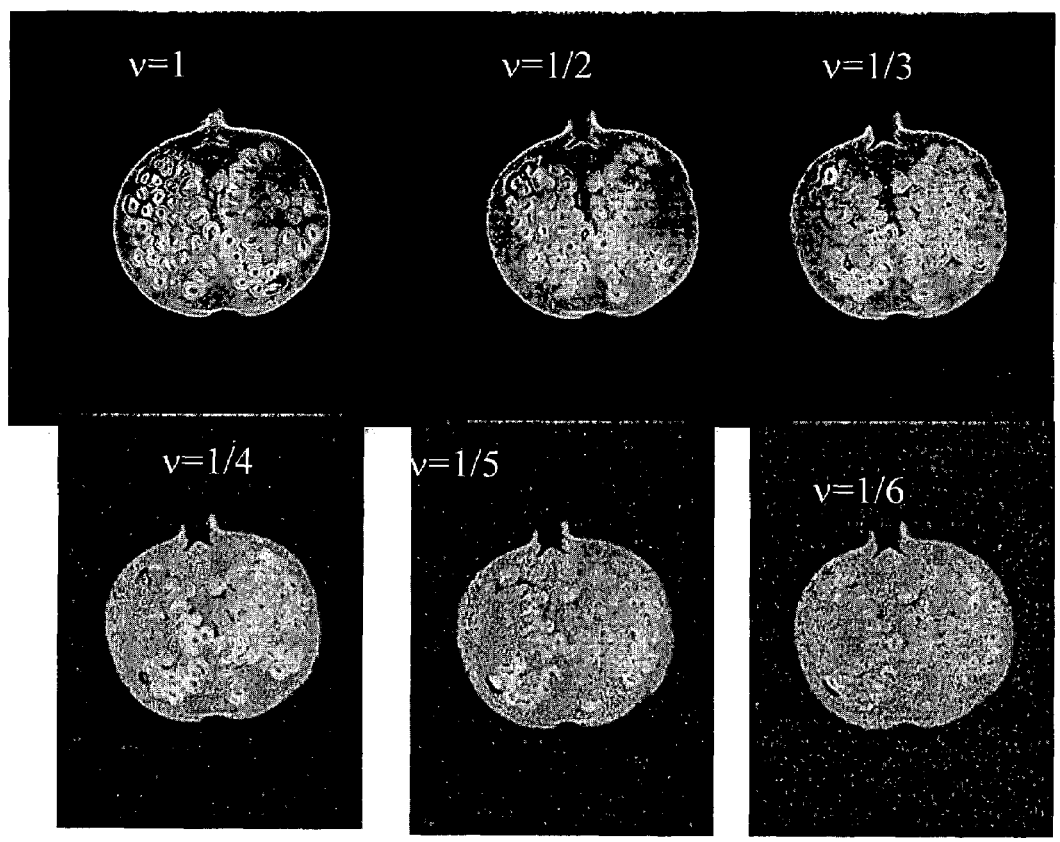

FIG. 13 shows images from FIG. 12 with the corrections for the geometric distortion.

Figure 14:
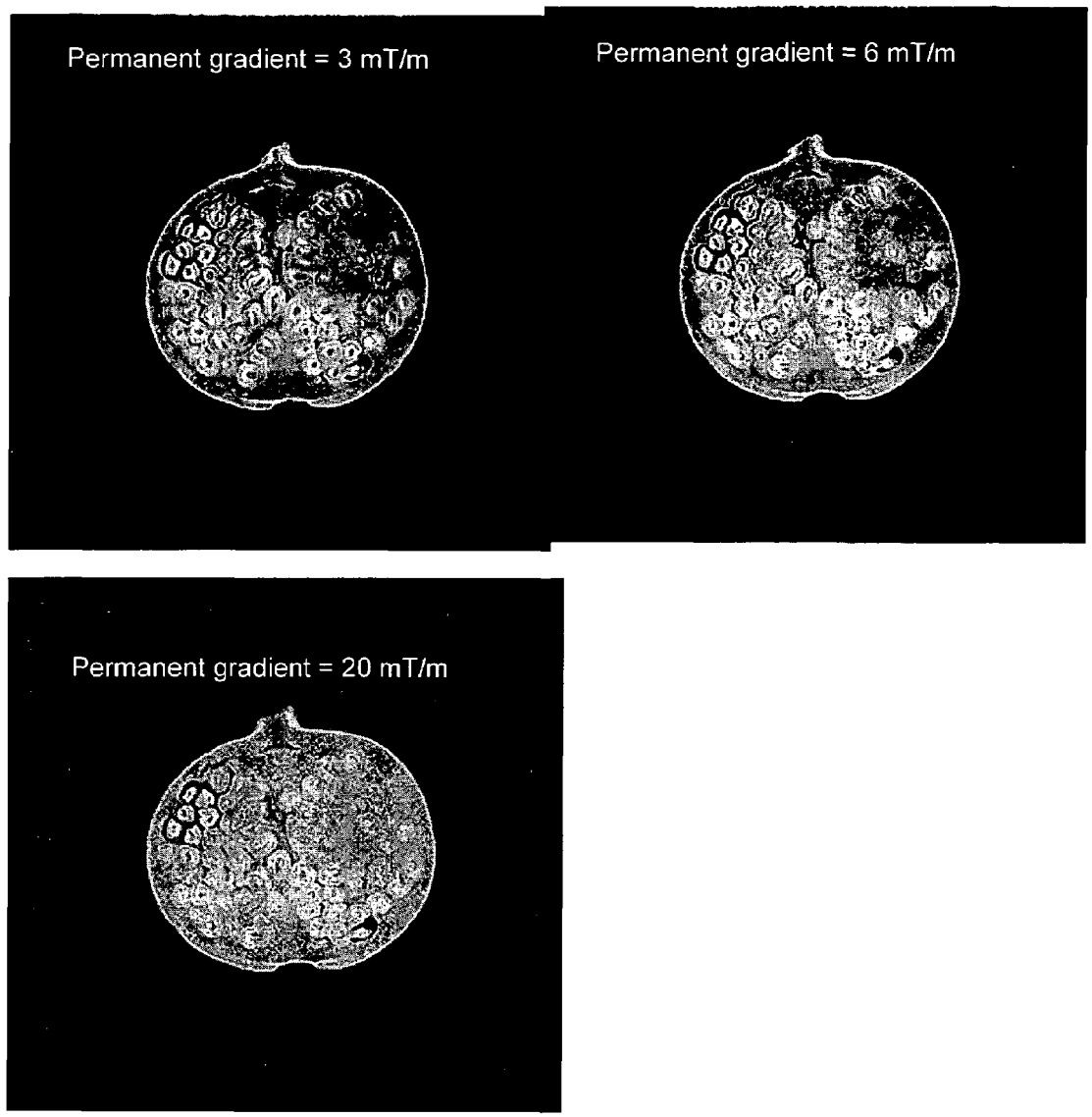

FIG. 14 illustrates that when the ratio between $G_0$ and $G_1$ equals 1, their strengths are simultaneously increased.

Figure 15:
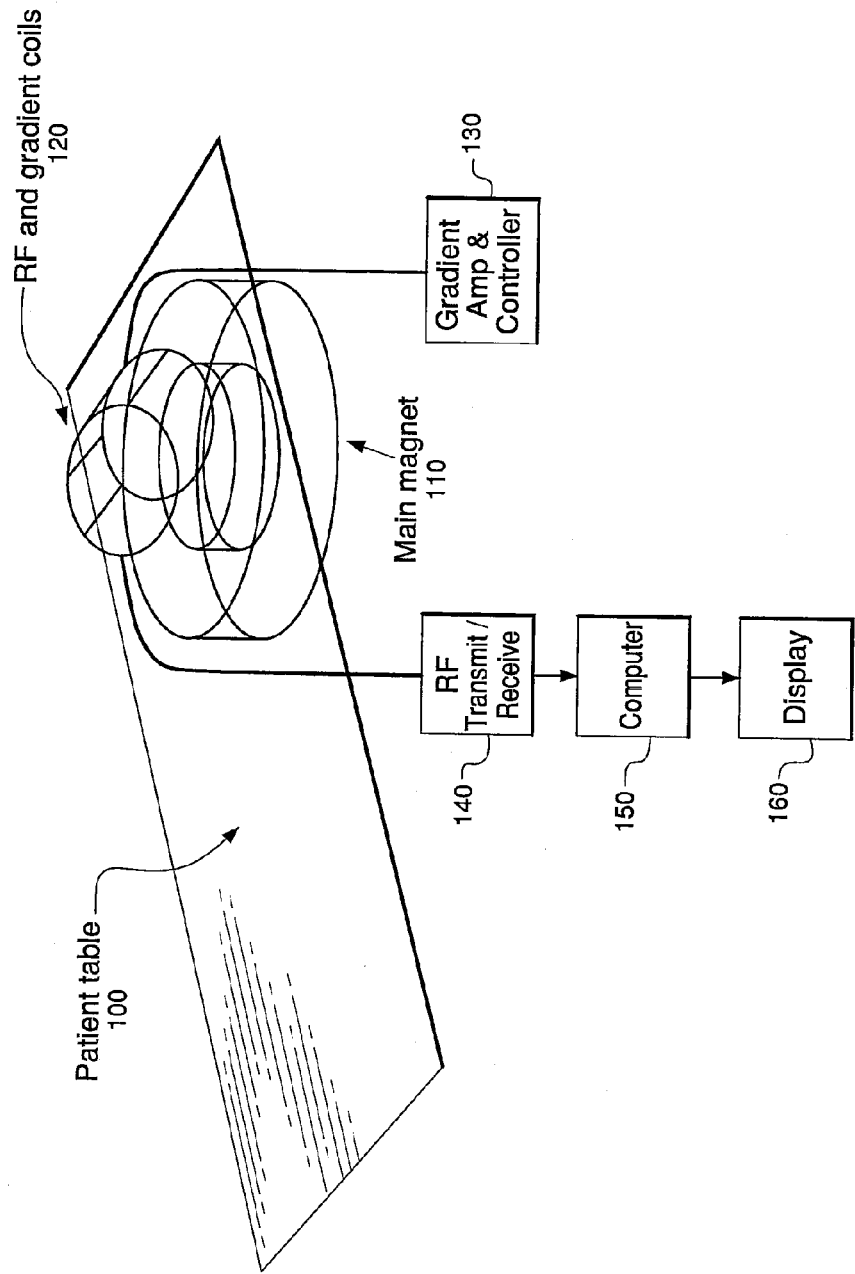

FIG. 15 illustrates a "one-sided" 3d MR-imaging system designed using the techniques of the invention wherein the sample (patient) would lie on a patient table to one side of the magnet.

DETAILED DESCRIPTION OF ILLUSTRATIVE EMBODIMENTS

Certain specific details are set forth in the following description with respect to FIGS. 1-15 to provide a thorough understanding of various embodiments of the invention. Certain well-known details are not set forth in the following disclosure, however, to avoid unnecessarily obscuring the various embodiments of the invention. Those of ordinary skill in the relevant art will understand that they can practice other embodiments of the invention without one or more of the details described below. Also, while various methods are described with reference to steps and sequences in the following disclosure, the description is intended to provide a clear implementation of embodiments of the invention, and the steps and sequences of steps should not be taken as required to practice the invention.

Overview

The present invention relates to three problems that arise in magnetic resonance (MR) imaging: (1) excitation, (2) spatial encoding, and (3) image reconstruction. There are, of course, many other issues that would arise in the practical implementation of such an imaging system. Nonetheless these issues must be addressed first.

First of all, one must understand what is meant by "imaging in an inhomogeneous background field" in accordance with the invention. At the outset, the problem of imaging with an inhomogeneous background field splits into two cases:

[Noncritical case] The function $|B_0|$ has no critical points in the field of view, the level sets of $|B_0|$ are smooth, and fit together nicely.

[Critical case] The function $|B_0|$ has critical points within the field of view.

The techniques available for spatial localization are different in each case and are treated separately.

Because the local resonance frequency is determined by the magnitude of the local field, small variations in $|B_0|$ are of much greater importance than small variations in its direction. In accordance with the invention, imaging is performed in an inhomogeneous background field if $\nabla|B_0|$ has a "large," time independent component throughout the imaging experiment. The inventors are not considering the sorts of "random" or localized inhomogeneities that arise from the physical properties of the object being imaged, e.g. susceptibility artifacts. For much of this application, the inventors assume that the function $|B_0|$ i "noncritical," i.e., has no critical points in the field of view, the level sets of $|B_0|$ are smooth, and fit together nicely. One can write:

$$B_0 = B_{00} + G_0, \quad (1)$$

where $B_{00}$ is a constant uniform field, and the spatial variation of $B_0$ around the constant background is captured by $G_0$. The choice of $B_{00}$ is, a priori, rather arbitrary. One usually selects $B_{00}$ as the value of $B_0$ at a central point in the excited slice.

The first problems that one encounters are connected to selective excitation. Because the permanent gradient tends to be large, a large RF-bandwidth may be required to excite a sufficiently wide slice. Beyond this bandwidth problem, one might also expect small variations in the direction of $B_0$ to lead to difficulties with selective excitation. However, this turns out to be a relatively minor problem. It can be shown mathematically that if the direction of $B_0$ does not vary too much, then a selective RF-pulse sequence excites spins lying in a region of space of the form:

$$\{(x,y,z): \omega_0 - \Delta\omega \leq \gamma|B_0(x,y,z)| \leq \omega_0 + \Delta\omega\}. \quad (2)$$

If $\nabla|B_0|$ does not vanish within this set then the selected slice is a nonlinear analogue of the region between two planes.

In the noncritical case, the permanent gradient in $B_0$ may be used as a slice select gradient. In this case, the problem of imaging in a noncritical, inhomogeneous field becomes, at least conceptually, the problem of imaging with a permanent slice select gradient. This is not an imposed gradient, which could be reversed, but rather a permanent and irreversible gradient that arises from the basic design of the imaging system and the placement of the sample. In the noncritical case, conditions on the background field may be obtained so that the measured signal can, up to appropriate changes in variable, be regarded as samples of a Fourier transform. In principle, the needed changes of variable can be computed with a knowledge of the background field, and the gradient fields throughout the field of view. The inventors' principal observation in this regard is that, so long as the direction of $B_0$ does not vary too much within the field of view, the most important property for the imaging system is to have a 2-parameter linear family of gradient fields. As explained below, the gradients themselves need not be linear.

Figure 1:
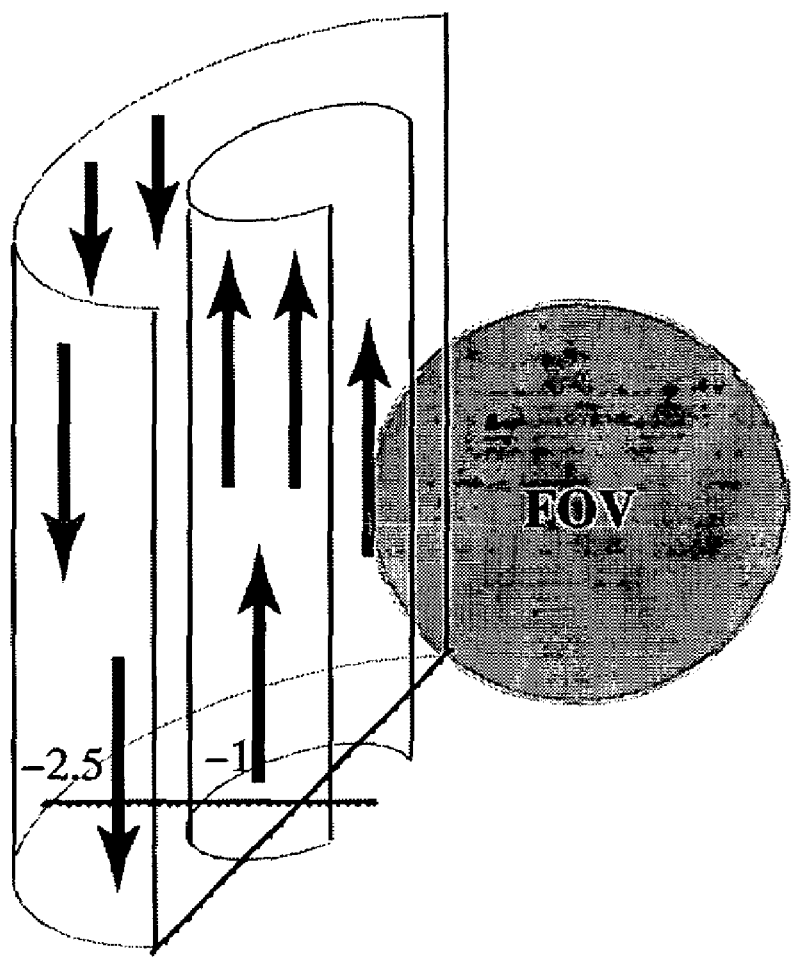
FIG. 1 illustrates an electromagnet constructed out of two concentric cylindrical segments where the inner cylinder subtends 270°, and the outer cylinder subtends 180°. As indicated, the FOV is a region of space exterior to the arcs of both cylinders.
Figure 2A:
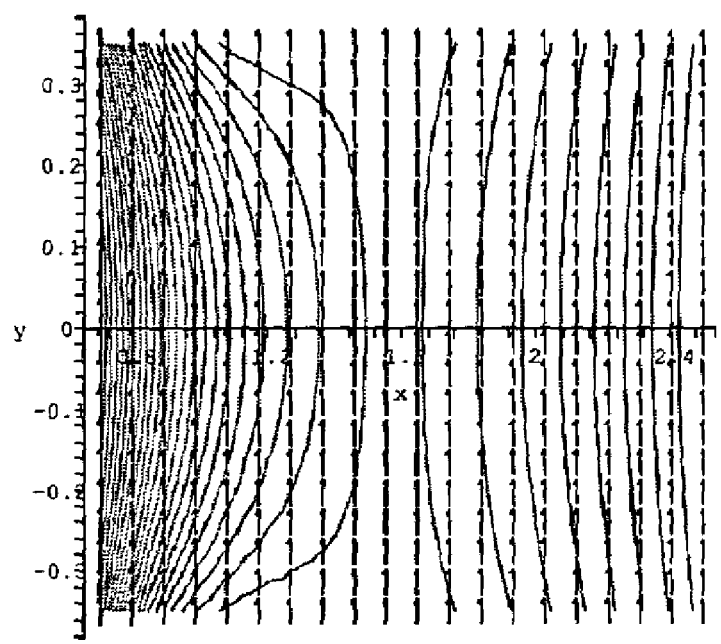
Figure 2B:
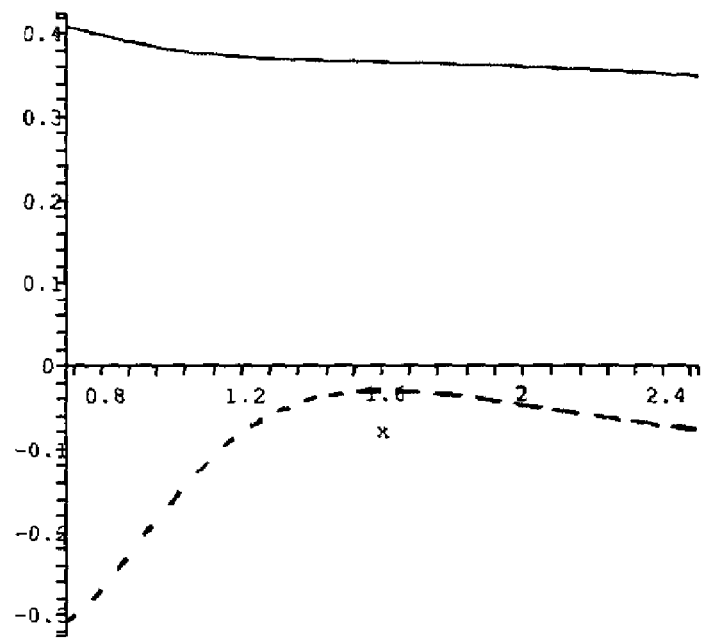
FIG. 2(b) illustrates a plot of $|B_0|$ (solid line) and $\nabla|B_0|/|B_0|$, (dashed line) along y=0.

As a concrete example, consider the following situation: one has two infinite, concentric arcs of cylinders with current running in opposite directions, along their axes. The field of view is a region outside of both arcs. The setup is shown in FIG. 1. With infinitely long cylinders, the field is independent of the z-coordinate and lies in the xy-plane. FIG. 2(a) shows level lines of the field generated by the apparatus in FIG. 1, along with vectors indicating its local direction. FIG. 2(b) shows the field strength (solid line), and the relative gradient (dashed line) $\nabla|B_0|/|B_0|$, along the y-axis.

At each point (x,y,z), the direction of the background field, $B_0(x,y,z)$, defines a "local z-direction." The transverse component of the magnetization at (x,y,z) is the part of the magnetization orthogonal to $B_0(x,y,z)$, This component of the magnetization precesses about $B_0(x,y,z)$, at the local Larmor frequency, which equals $\gamma|B_0(x,y,z)|$. As the definition of the "rotating reference frame" varies from point to point, one may work in the laboratory reference frame.

For purposes of the present patent application, the perturbations of $B_0$, used for spatial encoding (i.e. gradients), are referred to as "time independent" fields. Such fields are typically turned on for a period of time, and then turned off, and so are not, strictly speaking, time independent. With use this terminology to distinguish these fields from the RF-fields used for selective excitation. The RF-fields are constantly varying on the time scale of the Larmor period. The reason for this distinction is that, so long as $B_0$ is a very strong field, the important component of a "time independent" field is the component parallel to $B_0$, whereas the important components of an RF-field are those orthogonal to $B_0$. Throughout this description, it is assumed that the $B_0$-field is strong enough that the components of gradient fields, in directions orthogonal to it, can safely be ignored.

$B_0$ is used to denote magnetic fields in the direction of $B_{00}$ In most applications of MR it is only the spatial dependence of the magnitude of $B_0$ which is carefully accounted for. Indeed it is usually assumed that the gradients are "linear" so that (in standard homogeneous field imaging):

$$B_{00} = (0, 0, b_0) \quad (3)$$

$$B_0 = B_{00} + <(x,y,z), (g_x, g_y, g_z)> \quad (4)$$

The linear function $<(x,y,z),(g_x,g_y,g_z)>$ (or sometimes the vector $(g_x,g_y,g_z)$ itself) is called the "gradient." It is the projection of a gradient field in the direction of $B_0$. In the inhomogeneous case, one needs to be a bit more careful, and so the inventors work with the magnetic fields which generate the gradients. The present inventors distinguish between gradient fields, which are quasi-static magnetic fields used to induce perturbations in the background field and field gradients. Strictly speaking, the field gradient G generated by the gradient field G is defined to be:

$$G = \nabla \langle G, \frac{B_0}{|B_0|} \rangle \qquad (5)$$

If $|G_0| \ll |B_0|$ and $G_0$ is not too rapidly varying, then the following approximate value may be used:

$$G \approx \nabla \langle G, \frac{B_{00}}{|B_{00}|} \rangle, \qquad (6)$$

for the field gradient, in the computations.

In the MR-literature, a point where $\nabla |B_0|$ vanishes is sometimes called a "sweet spot." Following the usual practice in the mathematics literature, such a point is called a critical point of $|B_0|$. The value of $|B_0|$ at a critical point is called a critical value of $|B_0|$. The coordinates are normalized so that the critical point is located at $(0,0,0)$ and if $\omega_0$ denotes the critical value, then $\gamma |B_0(0,0,0)|$. The geometry of the level sets $S_\omega$, for values of $\omega$ near to $\omega_0$, is determined by the nature of the critical point that $|B_0|$ has at $(0,0,0)$. This is explained in Section 5 of [9]. Because the components of $B_0$ are harmonic functions, the function $|B_0(x,y,z)|$ is subharmonic. The maximum principle implies that $|B_0|$ cannot have a local maximum value. Thus $(0,0,0)$ can be either a saddle point or a local minimum. To the inventors' knowledge, the only case that has been considered in the literature is that of a saddle point. This case is analyzed in detail in Section 6 of the aforementioned paper by Epstein, entitled, *Magnetic Resonance Imaging in Inhomogeneous Fields*, Inverse Problems, Vol. 20 (2004), pp. 753-780, where a new explanation is given as to why this is a problematic geometry for imaging. In this document, examples are constructed to show that magnetic fields exist such that $|B_0|$ attains a nonzero local minimum value. These fields provide new opportunities for localized spectroscopy, which are not available in earlier approaches of this sort, e.g. FONAR and TOPICAL. In particular, with each acquisition, one can measure a complete FID generated by the material located in a single pixel.

The measurement process for background fields without critical points within the field of view is considered below as well as how to construct fields so that $|B_0|$ has an isolated minimum value.

Inhomogeneous Fields without Critical Points

Most approaches to magnetic resonance imaging in a homogeneous background field follow essentially the same sequence of steps:
1. The sample is polarized in the uniform background field.
2. Using a slice select gradient, the sample is selectively excited using an RF-pulse.
3. By reversing the slice select gradient, or using a refocusing pulse, the excited magnetization is rephased.
4. Using gradient fields, the excited magnetization is "spatially encoded."
5. The signal is acquired, possibly with additional spatial encoding.

In this first embodiment, the problem of imaging with an inhomogeneous background field without critical points is considered. A simplified model, with a background field, $B_0(x,y,z)$, of the form:

$$B_0(x,y,z) = (b_0 - Gz)\hat{z} \qquad (7)$$

is considered for $z \in [-z_{max}, z_{max}]$. While $G/b_0$ may be large, per unit distance, the field of view is constrained so that $b_0 \pm Gz_{max}$ is also assumed to be large. This means that $B_0$ is large within the field of view, and therefore, slowly varying perturbing fields, orthogonal to $B_0$, can safely be ignored. There are many possibilities for the placement of coils to generate the gradients and RF-pulses needed to do imaging. In some circumstances, these coils could be placed around the sample, in other cases they could be placed on one side of the sample. For a preliminary analysis, it is assumed that the gradient in $|B_0|$ is parallel to the direction of $B_0$. This simplifies the discussion, a little, but is not necessary to do the analysis. A similar analysis also applies to fields which are not assumed to point in a fixed direction, provided $|B_0|$ is large throughout the field of view, and $\nabla |B_0|$ does not vanish. This more general case is considered below.

The following convention is used in this section: The Fourier transform of a function $f$ is denoted by $F(f)$. For the laboratory frame, $\{\hat{x}, \hat{y}, \hat{z}\}$, with $\hat{z}$ parallel to $B_0$, then:

$$[a + ib, c] \leftrightarrow a\hat{x} + b\hat{y} + c\hat{z}, \qquad (8)$$

with the complex number, $a+ib$, representing the transverse component of the magnetization. The computations in this section are done in the resonance rotating reference frame defined by $b_0\hat{z}$.

In the analysis of fields without critical points, the permanent gradient in $B_0$ may be used as a slice select gradient. Leaving the sample stationary in the background field produces an equilibrium magnetization, $M_0(x,y,z)$, given by:

$$M_0 = C(T)\rho'(x,y,z) B_0(x,y,z) \qquad (9)$$

$$C(T) = \frac{1.0075}{T} Am^{-1} \text{ for protons in water.} \qquad (10)$$

Here $\rho'(x,y,z)$, is the density of water protons at $(x,y,z)$. As noted, the constant $C(T)$ is inversely proportional to T, the absolute temperature. To simplify notation, $\rho$ denotes $C(T)$ $\rho'$. A principal goal of MRI is the determination of the function $\rho(x,y,z)$. If $|B_0(x,y,z)|$ varies considerably over the support of $\rho(x,y,z)$, then it may be necessary to include $|B_0(x,y,z)|$ in the definition of the equilibrium magnetization. Such variation will result in a slowly varying shading of the image that can be removed by post-processing. In this section, it is assumed that this is not the case, and we use $b_0$ to denote $|B_0(x,y,z)|$ in the formula for the equilibrium magnetization.

In this embodiment, the slice select gradient does not have to be "turned on." While the Bloch equation analysis of selective excitation applies, essentially verbatim, a few remarks are in order. If $B_0$ always points in the same direction, as in equation (7), then the usual analysis of selective excitation, from the homogeneous case, applies without change. In general, the direction of $B_0$ may vary slowly over the field of view. In this case, a selective RF-pulse designed for use with a $B_0$-field having a permanent gradient, but uniform direction, may still be used as in equation (7). It may be shown mathematically that the main consequence of non-orthogonality between $B_0$ and $B_1$ is a decrease in the effective amplitude of $B_1$. If the angle between $B_0(x,y,z)$ and $B_1(x,y,z;t)$ is $$\frac{\pi}{2} + \phi,$$

then the effective RF-field at this point is $$\frac{(1 + \cos\phi)}{2} B_1(x, y, z; t).$$

Attenuating the RF slightly diminishes the flip angle and introduces a small phase error, but has very little effect on the selectivity of the pulse. If, over the extent of the sample, the angle between $B_1$ and $B_0$ is close to $$\frac{\pi}{2},$$

then there will be some (removable) shading in the image. Hence, if $B_1$ is designed to excite spins with offset frequencies in the band about the Larmor frequency, $[f_{min}, f_{max}]$, then the actual excited slice is given by the (possibly nonlinear) region of space $$\{(x,y,z): \omega_0 + f_{min} \leq \gamma |B_0(x,y,z)| \leq \omega_0 + f_{max}\}.$$

The slices are bounded by level sets of $|B_0(x,y,z)|$.

The first significant difference between imaging in homogeneous fields and in inhomogeneous fields occurs at step 3. In the latter case, it is not possible to reverse the slice select gradient to rephase the magnetization after the application of a selective pulse. The only realistic options are to use a self-refocused pulse or a refocusing pulse. A self refocused pulse, is only refocused once, so this option is not considered further.

Figure 3:
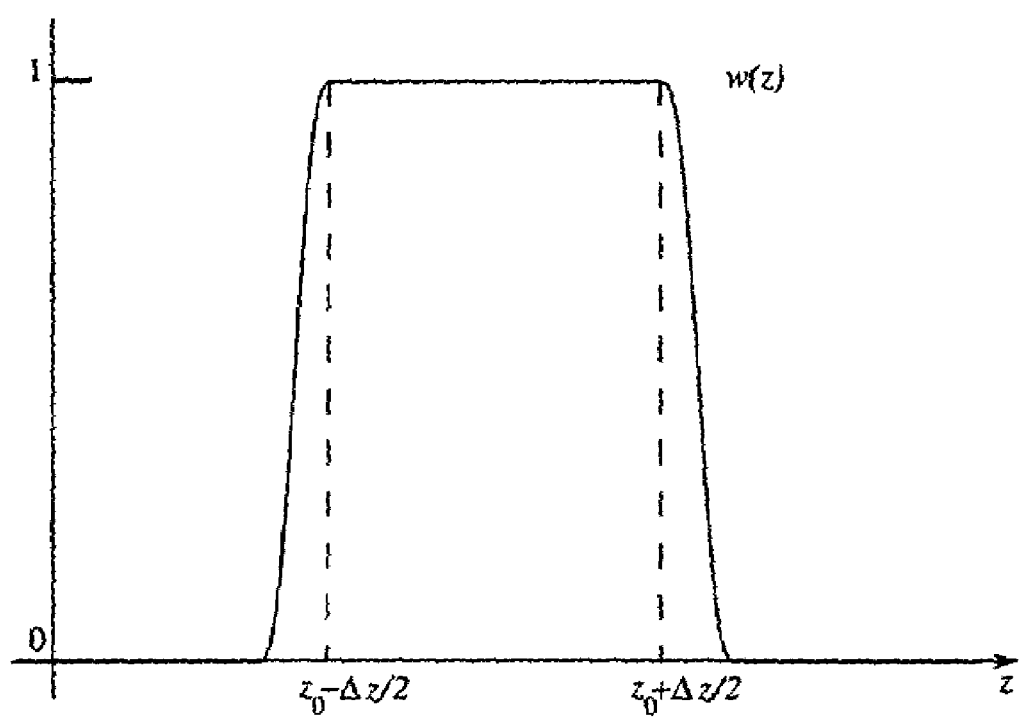
FIG. 3 illustrates a graph of a typical normalized magnetization profile.

A normalized excitation profile is shown in FIG. 3. Assuming $B_0$ is given by equation (7), then, at the end of a selective RF-pulse, the magnetization is given by:

$$M(x,y,z) = Cb_0 \rho(x,y,z)[e^{i\gamma Gz\tau_1} w(z), \text{sgn}(z)\sqrt{1-w^2(z)}] \quad (11)$$

with $\tau_1$ the rephasing time for the selective RF-pulse. The function sgn(z) takes the values ±1; it is included to allow for flip angles larger than 90°. In general sgn(z)=1 for z outside a finite band. If one were to immediately apply a refocusing pulse, then, at its conclusion, the magnetization would be given by:

$$M(x,y,z) = Cb_0 \rho(x,y,z)[e^{-i\gamma Gz\tau_1} w(z), \text{sgn}(z)\sqrt{1-w^2(z)}] \quad (12)$$

Normalizing so that t=0 at the conclusion of the refocusing pulse, the magnetization, as a function of space and time is given, for $t \geq 0$, by:

$$M'(x,y,z;t) = Cb_0 \rho(x,y,z)[e^{i\gamma Gz(t-\tau_1)} w(z), \text{sgn}(z)\sqrt{1-w^2(z)}] \quad (13)$$

and therefore:

$$M'(x,y,z;\tau_1) = Cb_0 \rho(x,y,z)[w(z), \text{sgn}(z)\sqrt{1-w^2(z)}] \quad (14)$$

As has been known since the work of Hahn, one can create spin echoes, even with a permanent field gradient. The analysis is only slightly different if the direction of $B_0$ is slowly varying. This leads to small variations in the degree to which the magnetization is refocused which, in turn, produces a slowly varying shading in the reconstructed image.

To measure the total density of spins within the slice, one could average the signal over a time interval $[\tau_1 - \tau_{acq}, \tau_1 + \tau_{acq}]$ leading to a measured signal of the form:

$$S_{echo} = C\omega_0^2 \int_{o3} \text{sinc}(\gamma Gz\tau_{acq}) b_{rec1}(x, y, z) \rho(x, y, z) w(z) \, dx \, dy \, dz. \quad (15)$$

Here, it is assumed that $\tau_{acq} \leq \tau_1$. Supposing that G is large, and $\Delta z$ is the width of the excited slice, the requirement that $\text{sinc}(\gamma Gz\tau_{acq})$ remain positive throughout the excited slice leads to a maximum reasonable value for $\tau_{acq}$:

$$\tau_{acq} \leq \frac{\pi}{\Delta f} \text{ where } \Delta f = \gamma G \Delta z. \quad (16)$$

Since the length of the time interval over which the signal is averaged effectively determines the bandwidth of the measured signal, it may be seen that, in inhomogeneous field imaging, the size of the permanent gradient effectively determines the minimum "receiver bandwidth." This question is analyzed at length in Section 4 of the Epstein paper referenced above.

In step 4, the encoding of spatial information, it is apparent from equation (13) that the phase of the transverse magnetization is marching inexorably forward. This suggests a stroboscopic approach to signal acquisition. By combining gradients with refocusing pulses, one could sample the Fourier transform of $\rho$. How often this procedure can be repeated is largely determined by the size of $T_2$, and how well the magnetization can be repeatedly refocused. If the permanent gradient is large, then diffusion effects might also lead to a rapid decay of signal strength. This approach to the problem has been considered by several groups of investigators. For the most part, the previous work uses pulsed gradients for spatial encoding, and refocusing pulses to repeatedly refocus the accumulating phase in the direction of the permanent gradient. These ideas are described in U.S. Pat. No. 4,656,425, as well as in U.S. Pat. No. 5,023,554. The idea is further developed by Crowley and Rose as described in U.S. Pat. Nos. 5,493,225 and 5,304,930. Pulsed gradients are also used in SPRITE, though for different reasons.

Crowley and Rose make the important observation that a large permanent gradient leads to a rapid traversal of k-space, and a short refocusing time. Accordingly, within the time constraints imposed by transverse relaxation, many samples can be collected. On the other hand, a large gradient means that, to excite a reasonably sized slice, requires a large RF-bandwidth and thereby an increased SAR. Indeed, as a refocusing pulse is required for each point sampled in k-space, these imaging sequences have a much larger SAR than most sequences used with homogeneous fields. In the afore-mentioned Epstein paper, the present inventor examined how SNR and SAR requirements limit the ratio $|\nabla|B_0||/|B_0|$.

Alternative approaches to the problem of spatial encoding and signal acquisition, which use a single refocusing pulse per line in k-space, will now be described. We first describe an embodiment using a 3-dimensional imaging protocol. Some applications of this idea lead to irregularly spaced samples, and so one might use a technique like regridding to obtain regularly spaced samples, before reconstructing an image. An analogue of a phase encoding-frequency encoding method and a radial, pure frequency encoding method are described. The latter approach is described first.

After the selective excitation, the magnetization is allowed to freely precess for an additional $\tau_2$ units of time so that, after a refocusing pulse, the magnetization is given by:

$$M(x,y,z)=Cb_0\rho(x,y,z)[e^{-i\gamma G z \tau_3}w(z), \text{sgn}(z)\sqrt{1-w^2(z)}] \qquad (17)$$

where $\tau_3=\tau_1+\tau_2$. At this point, a gradient of the form:

$$B_{fe0}=<(g_x,g_y,0),(x,y,z)>\hat{z} \qquad (18)$$

is turned on. If t is normalized so that the end of the refocusing pulse occurs at t=0, then the transverse magnetization is given, for $t \geq 0$, by:

$$M_{xy}(x,y,z;t)=Cb_0\rho(x,y,z)e^{i\gamma[Gz(t-\tau_3)+t(g_x x+g_y y)]}w(z) \qquad (19)$$

Sampling at times $t \in \{j\Delta t: j=0, \ldots, N\}$, one measures approximate values for $\{F(\bar{\rho})(j\Delta k_x, j\Delta k_y, j\Delta k_z-k_{zmax})\}$, where:

$$\bar{\rho}(x,y,z)=Cb_0\rho(x,y,z)b_{1rec}(x,y,z)w(z) \qquad (20)$$

and $$\Delta k_x=\gamma g_x \Delta t, \Delta k_y=\gamma g_y \Delta t, \Delta k_z=\gamma G \Delta t. \qquad (21)$$

Figure 4:
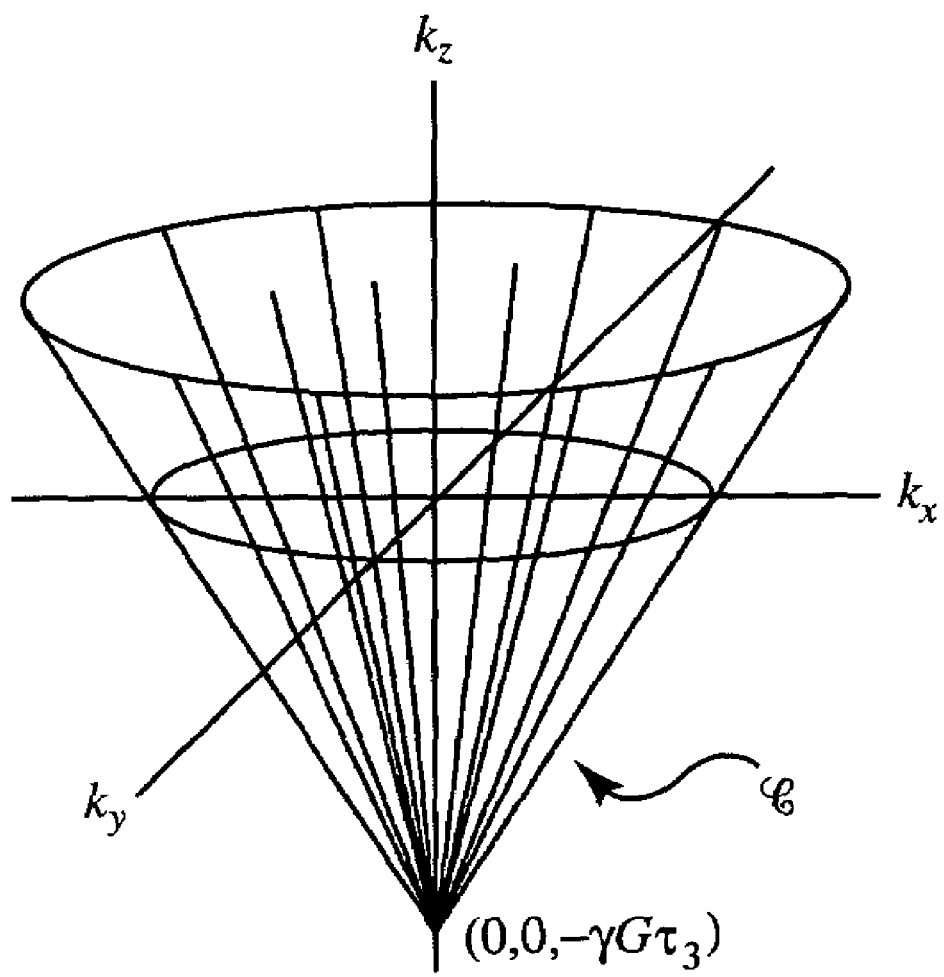
FIG. 4 illustrates the cone that contains the samples points for $F(\rho)$, showing some lines along which samples are acquired.
Figure 5:
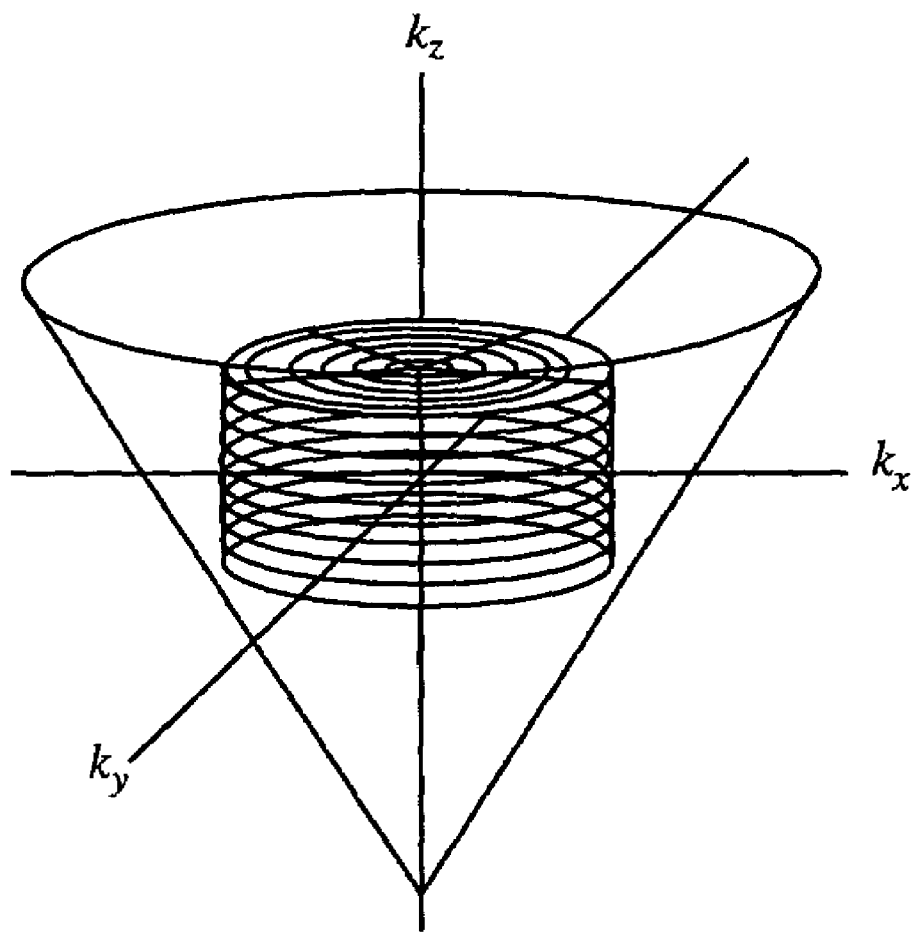
FIG. 5 illustrates the cylinder within the cone, in which the sample points for the regridded data lie.

By adjusting the coefficients of the gradient field, $B_{fe0}$, one can obtain samples of $F(\rho)$ along straight lines lying within a cone, C, with vertex at $(0,0,-\gamma G \tau_3)$, as shown in FIG. 4. By regridding, one can then obtain samples of $F(\rho)$ which are uniformly spaced on a cylindrical grid, lying inside a cylinder, K contained within the cone C, as shown in FIG. 5. An image could then be reconstructed by using the standard Fourier transform in the z-direction and a filtered back-projection algorithm in the transverse plane.

To use a method like regridding requires a certain amount of oversampling. For each sample point $p_j$ on the regular grid within K, severally irregularly spaced samples must be collected in a neighborhood of $p_j$. It is also clear that samples from near the vertex of C may not be usable in the regridding process. Additionally, the samples become rather spread out as one crosses the $k_z=0$ plane. It may be preferable, to measure $F(\rho)(k)$, for k with nonpositive $k_z$, and recover the values in the other half plane using the conjugate symmetry.

It is clear that there are many possible variations on this general approach to spatial encoding. For example, one might begin with a larger $\tau_3$ and a large initial gradient to first move the vertex of the cone to $(k_{x0},k_{y0},k_{z0})$. This constitutes a phase encoding step. After reducing the gradient, samples could then be collected along lines of the form: $(k_{x0},k_{y0},k_{z0})+t\gamma(g_x,g_y,G)$.

Indeed, one could turn off the x and y gradients and collect samples of the Fourier transform of $\rho$ along vertical lines in k-space. If the initial points $(k_{x0},k_{y0},k_{z0})$ are on a uniformly spaced grid in the $(k_x,k_y)$-plane, then a standard FFT could be used to reconstruct the image.

2-D Imaging Protocol

A second embodiment using a 2-dimensional imaging protocol will now be described. In this case, the permanent gradient is employed, along with a field of the form $G_{ss}=\eta_1{}^s G_1+\eta_2{}^s G_2$, to define the slice selection direction, and a field transverse to this direction, $G_{re}$ as the read out gradient. A third field of the form $G_{ph}=\lambda(\eta_1{}^P G_1+\eta_2{}^P G_2)$ is used as a phase encoding gradient. To describe the invention, a simple case is first considered wherein all of the gradients are linearly varying magnetic fields. As usual, it is assumed that the background field $B_0$ is sufficiently strong throughout D that components of fields orthogonal to $B_0$ have a very small effect on the measurements and can safely be ignored.

Analysis in the Linear Case

Let us suppose that $B_{00}=(0,0,b_0)$ and let:

$$B_0=(0,0,b_0)+(*,*,g_z z)=B_{00}+G_0$$

$$G_1=(*,*,x) \text{ and } G_2=(*,*,y) \qquad (22)$$

Here * is used to denote negligibly small field components orthogonal to $(0,0,b_0)$. The permanent field gradient is of the form:

$$G_z=(0,0,g_z), \qquad (23)$$

and we assume that one can generate fields $\eta_1 G_1+\eta_2 G_2$, with gradients of the form:

$$G_\eta=\eta_1(1,0,0)+\eta_2(0,1,0), \qquad (24)$$

where $|\eta_j| \leq m_g$.

Strong Transverse Gradients ($G_0 \leq G_1$)

The simplest case arises when $m_g \in g_z$. In this case, one uses for the slice select gradient the field $G_{ss}=g_z G_1+G_0$, and for the read gradient, the field $G_{re}=-g_z G_1+G_0$. The phase encoding gradient field is then $G_{ph}=\lambda(*,*,y)$, where $\lambda$ assumes values in the range $[-m_g,m_g]$. The slice select field gradient is then $G_{ss}=(g_z,0,g_z)$, while the read-out field gradient is $G_{re}=(-g_z,0, g_z)$. With these fields, the approach to imaging in accordance with the invention is the following:

1. Place the sample in the static field, $B_0$, long enough to polarize the nuclear spins.
2. Turn on the gradient field $g_z G_1$ to attain a slice select field gradient $G_{ss}=(g_z,0,g_z)$.
3. Apply a selective RF-pulse to flip spins lying in the region of space where:

$$f_0-\Delta f \leq \gamma|B_0+g_z G_1| \leq f_0+\Delta f,$$

leaving the spins outside this region essentially in their equilibrium state. If $f_0=\gamma b_0$, then the region of space excited is the slanted slice given by:

$$\{(x,y,z): -\Delta f \leq \gamma g_z(x+z) \leq \Delta f\}. \qquad (25)$$

If w(s) denotes a function that is 1 for $-\Delta f \leq s \leq \Delta f$ and zero outside a slightly larger interval, and $\tau_0$ denotes the rephasing time for the selective RF-pulse, at the conclusion of the RF-pulse the transverse magnetization has the form:

$$m(x,y,z;0)=\sin \alpha \rho(x,y,z)w(\gamma g_z(x+z))e^{i\tau_0 \eta g_2(x+z)} \qquad (26)$$

Here α is the flip angle and ρ is a spin density function, normalized to take account of the magnitude of the equilibrium magnetization, and $\tau_0$ is the rephasing time for the RF-pulse.

4. At the conclusion of the RF-pulse, the adjustable gradient $g_z G_1$ is switched off and the excited magnetization is allowed to precess under the influence of the permanent gradient $G_0$ for $\tau_1$ units of time. At the end of the free precession period, a 180° refocusing pulse is applied, this produces a transverse magnetization of the form:

$$m(x,y,z;1) = \sin\alpha\rho(x,y,z)w(\gamma g_z(x+z))e^{-i\gamma g_z(\tau_0(x+z)+\tau_1 z)} \quad (27)$$

5. The magnetization is now rewound in preparation for read-out: the gradient field $g_zG_1$ is again turned on and the excited magnetization is allowed to freely precess in the field $g_zG_1+G_0$ for $$\tau_0 + \frac{1}{2}\tau_1$$

units of time. To phase encode, the gradient field is turned on:

$$G_{ph} = \frac{-2\lambda\tau_1}{2\tau_0+\tau_1}g_zG_2.$$

At the conclusion of this free precession period, the transverse magnetization takes the form:

$$m(x, y, z; 2) = \sin\alpha\rho(x, y, z)w(\gamma g_z(x+z))e^{-i\frac{1}{2}\gamma g_z\tau_1(z-x+\lambda y)} \quad (28)$$

6. To read out the magnetization, one immediately turns on the field $-g_zG_1$. If $t=0$ at the start of the acquisition, then the signal available for sampling is:

$$S(t) = \quad (29)$$

$$\int_D \sin\alpha\rho(x, y, z)w(\gamma g_z(x+z))e^{-i\frac{1}{2}\gamma g_t(\tau_1-t)(z-x)}e^{-i\frac{1}{2}\gamma\lambda g_z\tau_1 y}dxdydz$$

One may change variables in this integral, letting $a=z+x$ and $b=z-x$, to obtain:

$$S(t) = \frac{1}{2}\int_D \sin\alpha\rho\left(\frac{a-b}{2}, y, \frac{a+b}{2}\right) \quad (30)$$

$$w(\gamma g_z a)e^{-i\frac{1}{2}\gamma g_z(\tau_1-t)b}e^{-i\frac{1}{2}\gamma\lambda g_z\tau_1 y}dadydb$$

This can be interpreted as the 2-dimensional Fourier transform of the slice average:

$$\bar{\rho}(y, b) = \frac{1}{2}\int_{\frac{f_0-\Delta f}{\gamma g_z}}^{\frac{f_0+\Delta f}{\gamma g_z}} \rho\left(\frac{a-b}{2}, y, \frac{a+b}{2}\right)w(g_z a)da. \quad (31)$$

Figure 7:
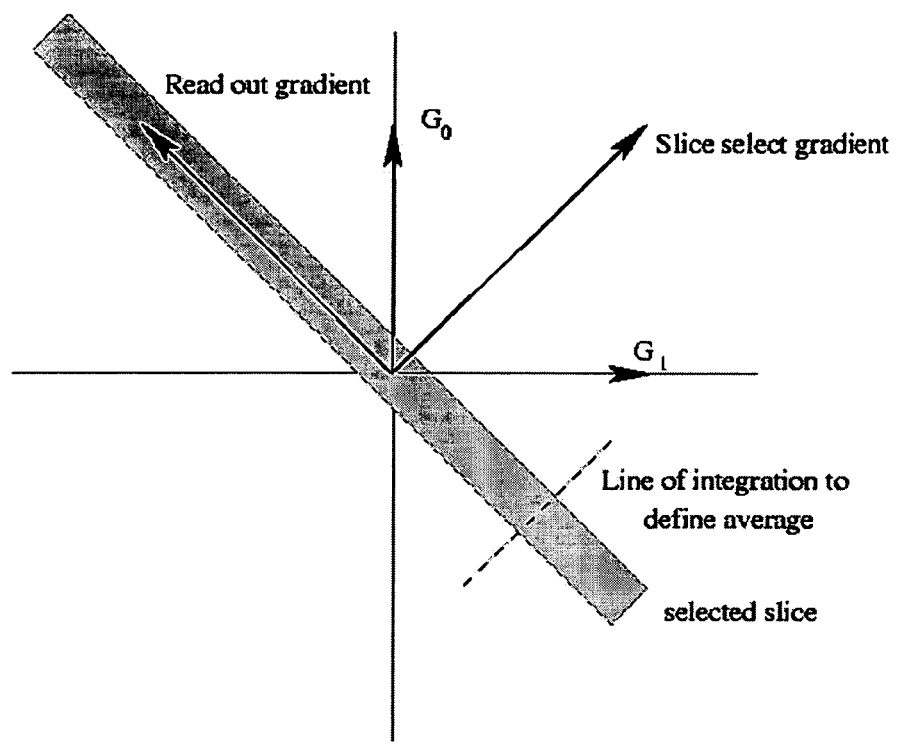
FIG. 7 illustrates slant slice imaging with an adjustable gradient of equal strength to the permanent gradient.

The slice averaging is illustrated in FIG. 7. The signal is therefore:

$$S(t) = \int \bar{\rho}(y, b)e^{-i\frac{1}{2}\gamma g_z[(\tau_1-t)b+\lambda\tau_1 y]}dydb. \quad (32)$$

At time t the signal is $\rho(k(t))$, where:

$$k(t) = \frac{\gamma g_z}{2}(\lambda\tau_1, (\tau_1-t)).$$

Figure 8:
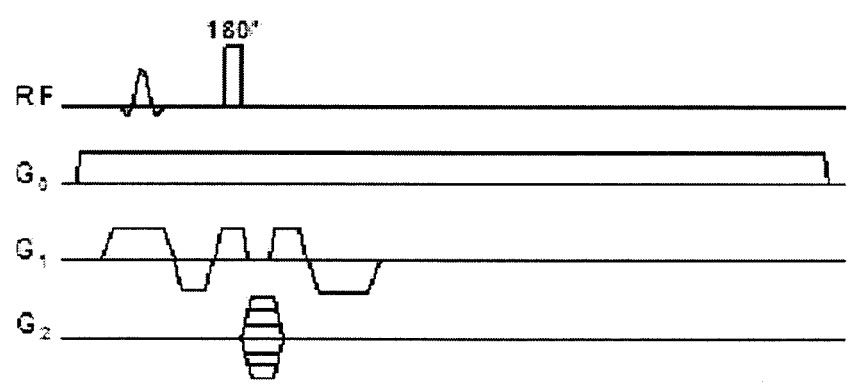
FIG. 8 illustrates a timing diagram for the slant slice imaging method shown in FIG. 7.
Figure 9:
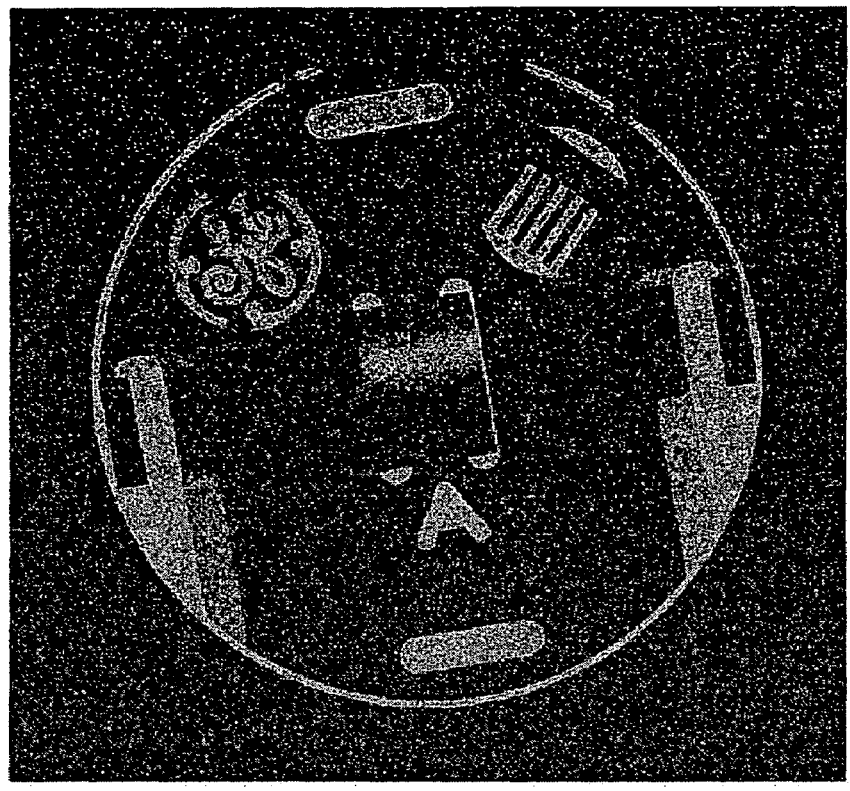
FIG. 9 illustrates an image created from measurements made with a permanent background field and the imaging sequence shown in FIG. 8.

This pulse sequence is illustrated in the timing diagram shown in FIG. 8 and an image of a phantom using this approach is shown in FIG. 9.

There are several possible variations in this approach that lead to the same result. For example, one could refocus immediately following the selective excitation. After the refocusing pulse, the magnetization would be allowed to freely precess, under the influence of the permanent gradient alone for $2\tau_0$ time units. At the conclusion of this free precession period, the magnetization could again be refocused. The signal would then be read out with read-out gradient equal to $-g_zG_1$, as before. At the start of the read out, the transverse magnetization would equal:

$$m(x, y, z; 2') = \sin\alpha\rho(x, y, z)w(\gamma g_z(x+z))e^{-i\frac{1}{2}\gamma g_z\tau_0(z-x+\lambda y)} \quad (33)$$

Weak Transverse Gradients ($G_0 \gg G_1$)

What makes the previous case especially simple is the assumption that the apparatus can produce adjustable gradients, with the strength of the field gradient at least equal to the strength of the permanent field gradient. This is by no means necessary for the method to succeed. The only modification is in the definition of the slice average $\bar{\rho}(y,b)$. This more general case is now described.

The following is an illustrative case, with many possible variations that will not be spelled out. Suppose that one can generate adjustable field gradients that are smaller than the magnitude of the permanent field gradient in $B_0$. As before it is assumed that:

$$G_0=(*,*,g_zz), G_1=(*,*,x) \text{ and } G_2=(*,*,y),$$

and that one can generate $\rho_1 G_1 + \rho_2 G_2$ where $|\eta_1|, |\eta_2| < m_g \ll g_z$. The same steps are followed as described above. For the slice select gradient, one can use $G_0 + g_xG_1$, as before one can use $\lambda g_xG_2$ for phase encoding and $G_0 - g_xG_1$ as the read out gradient. Supposing that a scheme is used with two refocusing pulses, the calculations above are not repeated but one skilled in the art will appreciate that the signal equation now reads:

$$S(t) = \int_D \sin\alpha\rho(x, y, z)w(\gamma g_z(x+z)) \quad (34)$$

$$e^{-i\frac{1}{2}\gamma g_z(\tau_0-t)(g_zz-g_xx)}e^{-i\frac{1}{2}\gamma\lambda g_x\tau_0 y}dxdydz$$

Figure 10:
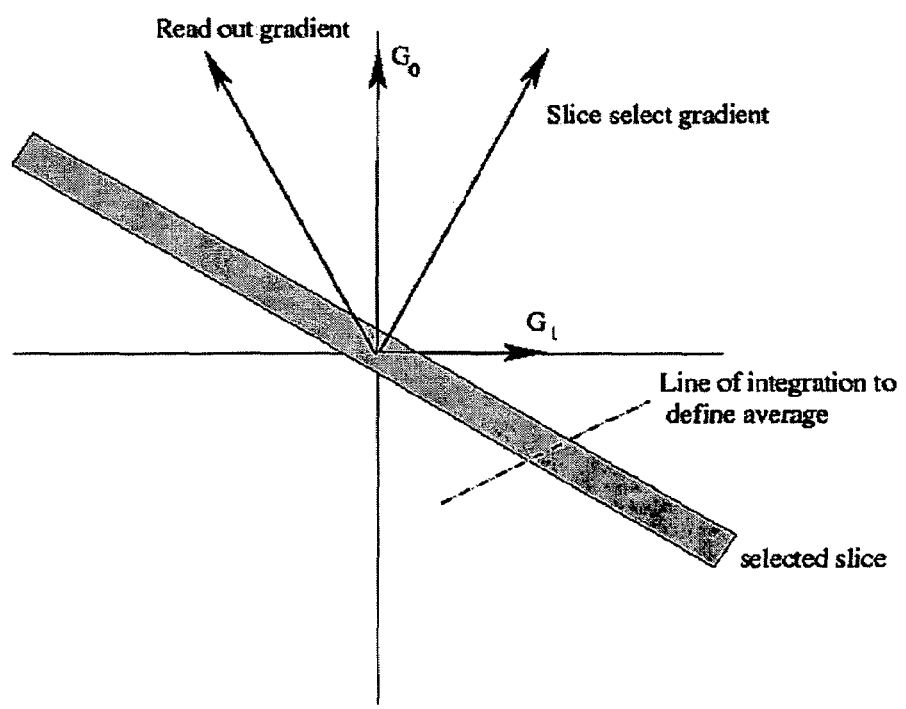
FIG. 10 illustrates slant slice imaging with an adjustable gradient of smaller strength than the permanent gradient.

This can also be interpreted as a 2d-Fourier transform of an average over the excited slice. The only difference between this case and the previous case is that the average is over lines that meet the slice at a fixed angle, not necessarily 90°. This is shown in FIG. 10.

To see this analytically, the variables are changed setting:

$$a = \frac{g_zz - g_xx}{g} \quad b = \frac{g_zx + g_xz}{g} \quad (35)$$

where $g=\sqrt{g_x^2+g_z^2}$. This gives:

$$S(t) = \int_D \sin\alpha\rho\left(\frac{g_zb - g_xa}{g}, y, \frac{g_zb - g_xb}{g}\right) \quad (36)$$

$$w\left(\frac{\gamma}{g}((g_z^2 - g_x^2)a + 2g_zg_xb)\right)$$

$$e^{-i\frac{1}{2}\gamma g(\tau_0-t)a}e^{-i\frac{1}{2}\gamma\lambda g_x\tau_0 y}dbdyda$$

Changing variables in the b-integral, setting:

$$s = \frac{(g_z^2 - g_x^2)a + 2g_x g_z b}{g^2} \quad b = \frac{(g_x^2 - g_z^2)a + g^2 s}{2g_x g_z} \tag{37}$$

one obtains:

$$S(t) = \int \bar{\rho}(a,y) e^{-i\gamma(g(\tau_0-t)a + \lambda \tau_0 g y)} dy\, da. \tag{38}$$

where:

$$\bar{\rho}(a, y) = \frac{g^2}{2g_x g_z} \int \rho\left(\frac{(s-a)}{2g_x}, y, \frac{g(s+a)}{2g_z}\right) w(g\gamma s) ds \tag{39}$$

Thus, $\bar{\rho}$ is $\rho$ averaged along lines with slope $(g_z, 0, g_x)$. These are lines orthogonal to the read-out direction $(-g_x, 0, g_z)$, which are not, in general, parallel to the slice select direction $(g_x, 0, g_z)$. In the case at hand, the lines over which $\rho$ is averaged make an angle $\theta$ with the slice select direction where:

$$\cos\theta = \frac{2g_x g_z}{g_x^2 + g_z^2}. \tag{40}$$

The length of the intersection of these lines with the selected slice is minimized when $\theta=90°$, hence this length is slowly varying for $\theta$ close to $90°$.

The Dependence of SNR on the Permanent Gradient Strength

The signal-to-noise ratio attainable using the procedures described above is now considered. The analysis of the SNR is essentially the same as it would be in a standard 2-dimensional imaging system. The main effects of a large permanent gradient are to reduce the physical thickness of the excited slice, thereby reducing the signal, as well as to reduce the allowable spacing, $\Delta t$, between the acquisition of successive samples, thereby increasing the receiver bandwidth. Suppose that one has a slice thickness d and a rectangular field-of-view of size L. If $\Delta x$ denotes the (isotropic) pixel length, $\Delta t$ is the acquisition time and N-samples are collected in each direction, then:

$$SNR \propto d\Delta x^2 N\sqrt{\Delta t}. \tag{41}$$

It is desired to understand how the strength of the permanent gradient and the ratio $v = g_x/g_z$ affects the SNR. This brings the FOV into the equation, along with the gradient strength. Suppose that: $g = \sqrt{|G_0|^2 + |G_1|^2}$, then, to avoid aliasing, one would need to take:

$$\Delta t \leq \frac{\sqrt{1+v^2}}{\gamma g_x L}. \tag{42}$$

Using that $L=N\Delta x$, combining (41) and (42) one obtains:

$$SNR \propto d\Delta x \sqrt{\frac{L(1+v^2)}{g_x}}. \tag{43}$$

Thus, the SNR is not directly affected by the presence of a strong permanent background gradient. It is indirectly affected, because in order to get the desired resolution the maximum frequency sampled in k-space must satisfy:

$$k_{\max} = \frac{1+v^2}{2d(1-v^2)}.$$

If $v$ is close to zero ($g_x = g_z$), then a thin slice is needed to get high resolution. This has the effect of lowering the SNR and would necessitate using several averages of each line. Beyond this, a large gradient also may lead to a thin slice, if one is constrained in the amount of RF-power one may apply. This also diminishes the SNR. These effects are illustrated in FIGS. 12 and 13, which show images of a pomegranate obtained using different values for $v$. FIG. 12 shows images of a pomegranate made using the slant-slice protocol with various values of the ratio $$v = \frac{g_x}{g_z}.$$

In FIG. 12, the geometric distortion caused by the slant of the slice has not been corrected, whereas in FIG. 13 it has been. The applied (readout and slice select) gradients have amplitude 3 mT/m, and the amplitude of the permanent gradient ranged between 3 and 18 mT/m. The slice thickness in Hertz is kept fixed throughout these images, which in turn means that the slice thickness in mm decreases as the gradient strength increases. All images have the same intrinsic resolution. The SNR decrease is caused by the decrease in signal due to the thinning of the slice. The following parameters were used for the scan in FIG. 12: TE=12 ms, TR=400 ms, 256 PE steps, Scan time=102 sec., FOV=256× 256 mm².

FIG. 13 shows images from FIG. 12 with the corrections for the geometric distortion.

On the other hand, as noted by Rose and Crowley, a strong permanent gradient causes k-space to be rapidly traversed and so one can, in principle, refocus the transverse magnetization and reread the same line several times. Indeed, the time to traverse a line in k-space is proportional to the strength of the read-out gradient. Hence, if $v$ is not too small, then within a single repeat time, one could refocus the magnetization and reread the line a number of times proportional to g, and thereby regain some of the lost SNR, without any increase in imaging time. In FIG. 14 we show images where the ratio between $G_0$ and $G_1$ equals 1, but their strengths are simultaneously increased. The slice thickness (in mm) is held constant. Notice the moderate decrease in the SNR as the gradient strength is increased. All images have the same intrinsic resolution.

The Resolution in the Linear Case

If one can generate an adjustable gradient of strength equal to that of the permanent gradient, then the pixels are rectangular and the resolution is determined by the usual heuristic formula:

$$\Delta x \approx \frac{1}{k_{\max}}. \tag{44}$$

If the maximum adjustable gradient $|G_1|$ is smaller than the permanent gradient, $|G_0|$, then there is additional averaging involved in signal acquisition. To quantify this effect one can make the following simplifying assumption: the spin density $\rho$ is constant along lines parallel to the slice select direction. Indeed, this is also a "worst case" analysis, when comparing the slant slice protocol to a protocol with averaging parallel to the slice direction (i.e. $|G_0|=|G_1|$). This assumption is reasonable for thin slices and a slowly varying spin density. In this case, at least within the excited slice, one gets:

$$\rho(x, z) \approx f\left(\frac{-xg_z + zg_x}{g}\right). \tag{45}$$

One uses $g_x = |G_1|, g_z = |G_0|$, to simplify the notation. To simplify the analysis, one may ignore the third dimension, which would, in any case be obtained by phase encoding in a direction orthogonal to the plane spanned by $G_0$ and $G_1$.

Ignoring the third dimension, the signal equation becomes:

$$S(t) = \int_{-\frac{L}{2}}^{\frac{L}{2}} \left(\frac{g^2}{2g_xg_z}\right) \int f\left(a\frac{g^2}{2g_xg_z} - s\frac{g_z^2 - g_x^2}{2g_xg_z}\right) w(g\gamma s) ds e^{-2\pi i k a} da, \tag{46}$$

where $2\pi k = \gamma(\tau_0 - t)g$. Letting:

$$\sigma = s\frac{g_z^2 - g_x^2}{2g_xg_z}$$

obtains:

$$S(t) = \int_{-\frac{L}{2}}^{\frac{L}{2}} \left(\frac{g_z^2 + g_x^2}{g_z^2 - g_x^2}\right) \int f\left(a\frac{g^2}{2g_xg_z} - \sigma\right) w\left(\gamma g\frac{2\sigma g_xg_z}{g_z^2 - g_x^2}\right) d\sigma e^{-2\pi i k a} da, \tag{47}$$

One final change of variables, gives this integral a very simple interpretation:

$$\alpha = a\frac{g^2}{2g_xg_z}, \tag{48}$$

obtains:

$$S(t) = \int_{-\frac{L}{2}}^{\frac{L}{2}} \left(\frac{2g_xg_z}{g_z^2 - g_x^2}\right) \int f(\alpha - \sigma) w\left(\gamma g\frac{2\sigma g_xg_z}{g_z^2 - g_x^2}\right) d\sigma e^{-2\pi i \frac{g_xg_z}{g^2} \alpha} d\alpha, \tag{49}$$

The measurement is the Fourier transform, at frequency $$\frac{2g_xg_z}{g^2}k,$$

of the convolution of $f$ with:

$$W(\sigma) = \left(\frac{2g_xg_z}{g_z^2 - g_x^2}\right) w\left(\gamma g\frac{2\sigma g_xg_z}{g_z^2 - g_x^2}\right). \tag{50a}$$

Thus the slanted slice has three different effects on the resolution:

1. It reduces the effective maximum frequency sampled by a factor of $$\frac{2g_xg_z}{g^2}$$

and scales the sample spacing in k-space by the same factor:

$$k_{max,ro} = \frac{2g_xg_z}{g^2} k_{max} \text{ and } \Delta k_{ro} = \frac{2g_xg_z}{g^2} \Delta k \tag{50b}$$

2. It causes blurring due to the convolution with W along the slanted line. As $g_x$ approaches $g_z$ the convolution approaches convolution with a scaled delta function.
3. If the angle $\theta$ is close to zero, so that the effect of the convolution with W cannot be removed, then the effective field of view is the support of $W*f$, rather than the support of $f$.

The effect of the convolution can, in principle, be removed if the Fourier transform of W does not vanish in the interval $$\left[-\frac{2v}{1+v^2} k_{max}, \frac{2v}{1+v^2} k_{max}\right].$$

Suppose that $w(s) = \chi_{[-\gamma d, \gamma d]}(s)$, then $$\hat{W}(k) = \frac{2v}{\pi(1-v^2)k} \sin\left(\pi dk \frac{1-v^2}{2v}\right). \tag{50c}$$

Hence, the effect of the slant slice convolution can be removed, without excessive amplification of the noise, for frequencies that satisfy:

$$k << \frac{v}{d(1-v^2)}. \tag{51}$$

Recalling that $k_{max}$ is also scaled, the resolution is effectively given by $$\Delta x \approx \frac{1+v^2}{2v} \frac{1}{k_{max}}, \tag{52}$$

provided:

$$k_{max} < \frac{1}{2d} \frac{1+v^2}{1-v^2}. \tag{53}$$

Note that $k_{max} = \gamma N \Delta t g$ if $2N+1$ samples are collected. This shows that the resolution in the readout direction is effectively determined by $g_x$:

$$\Delta x \approx \frac{\sqrt{1+v^2}}{2\gamma N \Delta t g_x}.$$

Putting together the two formula shows that this approach has an effective resolution limit:

$$\Delta x_{\lim} \approx d \frac{1-v^2}{v} = 2d \frac{\sin\theta}{\cos\theta}, \tag{54}$$

where $\theta$ is the angle between the slice select direction and the direction along which the spin density is averaged. With this modality, it may be desirable to use thin slices, measured many times. In principle, this would allow the recovery of any lost resolution, though at the cost of additional acquisition time.

Inhomogeneous Fields ithout Critical Points, General Case

The general case of imaging with an inhomogeneous field without critical points is now considered. As before, the permanent gradient in the background field may be used as a slice select gradient, or part of a slice select gradient. Several investigators have obtained partial results in this direction. In the prior art, the analysis is either perturbative, or done with unnecessarily restrictive hypotheses on the background field or the gradients. In this embodiment, the inventors provide minimal hypotheses on the background and gradient fields under which the measurements can, after a change of variables in physical space, be interpreted as samples of the ordinary Fourier transform.

The following notational conventions will be used: suppose that the object being imaged lies in a region of space that is denoted by D, where D is the field-of-view. The object is described by a density function $\rho(x,y,z)$, supported in D. As usual $B_0$ denotes the background field.

1. For purposes of the present description:

$$\phi_0(x,y,z)=|B_0(x,y,z)|,$$

and suppose it takes values in $[c_0,c_1]$, for points lying in D. The local Larmor frequency at $(x,y,z)$ is $\gamma\phi_0(x,y,z)$.

2. If $f$ is a real valued function defined in a region D, then for each $c \in R$:

$$f^{-1}(c)=\{(x,y,z) \in D : f(x,y,z)=c\}$$

The initial assumptions concern the function $\phi_0(x,y,z)$:

(a) The function $\phi_0(x,y,z)$ has no critical points within the field-of-view. This means that the level sets:

$$S_{\gamma c}=\{(x,y,z) \in D : \phi_0(x,y,z)=c\} \tag{55}$$

are smooth. The level sets are labeled by the local Larmor frequency.

(b) It is assumed that the coordinates $(x,y,z)$ are chosen so that each level set $S_{\gamma c}$ can be represented as a graph over a (fixed) region R in the (x,y)-plane. In other words, there is a smooth function $z(x,y,c)$ so that $\phi_0(x,y,z(x,y,c))=c$ for $c \in [c_0,c_1]$ and therefore:

$$S_{\gamma c}=\{(x,y,z(x,y,c)) : (x,y) \in R\} \tag{56}$$

With these assumptions, the region D is the set:

$$D=\{(x,y,z(x,y,c)) : (x,y) \in R \text{ and } \in [c_0,c_1]\}.$$

The second assumption is not strictly necessary. Though, without something like it, one cannot expect to use the Fourier transform, in any simple way, to reconstruct the spin density. Indeed the mathematical analysis required becomes vastly more complicated.

A formula will now be provided for the measured signal without additional gradients, which will later be modified to include the effect of gradients. Let $\omega_0$ denote $\gamma\phi_0(0,0,0)$, and assume that $[\omega_0-\Delta\omega,\omega_0+\Delta\omega]$ is contained in $[\gamma c_0,\gamma c_1]$. Suppose that the polarized sample is irradiated with a selective RF-pulse designed to flip spins lying in the region where the local Larmor frequency lies between $\omega_0-\Delta\omega$ and $\omega_0+\Delta\omega$. This can be described in terms of an excitation profile $w(\phi_0)$. For example, an ideal 90°-flip has excitation profile given by:

$$w_{90}(c)=1 \text{ for } \gamma c \in [\omega_0-\Delta\omega,\omega_0+\Delta\omega] \tag{57}$$

$$w_{90}(c)=0 \text{ for } \gamma c \in [\omega_0-\Delta\omega,\omega_0+\Delta\omega]. \tag{58}$$

After the initial RF-pulse, the signal as a function of time is given by:

$$S_0(t) = C\gamma \int_D \rho(x,y,z) b_{1rec}(x,y,z) \phi_0^2 \tag{59}$$
$$(x,y,z) w(\phi_0(x,y,z)) dx\,dy\,dz$$

One factor of $\phi_0(x,y,z)$ comes from the definition of the equilibrium magnetization and the other comes from Faraday's Law. Time is labeled so that $t=0$ corresponds to the spin echo induced by a refocusing pulse as described in the previous section. Using the second assumption, the variables are changed to $(x,y,c)$, obtaining:

$$S_0(t) = C\gamma \int_R \int_{c_0}^{c_1} \frac{\rho(x,y,c) b_{1rec}(x,y,c)}{\partial_z \phi_0(x,y,z(x,y,c))} c^2 w(c) dc\,dx\,dy \tag{60}$$

The denominator in equation (60) is computed using the chain rule. It is the Jacobian of the transformation $(x,y,z) \to \phi_0(x,y,z)$. To simplify the notation $\rho(x,y,c)$ and $b_{rec1}(x,y,c)$ denote $\rho(x,y,z(x,y,c))$ and $b_{1rec}(x,y,z(x,y,c))$ respectively.

As above, demodulating and averaging $S_0(t)$ over a sufficiently small time interval $[-\tau_{acq},\tau_{acq}]$ gives:

$$\overline{S}(0) = C\gamma \int_R \int_{c_0}^{c_1} \frac{\rho(x,y,c) b_{1rec}(x,y,c)}{\partial_z \phi_0(x,y,z(x,y,c))} \tag{61}$$
$$c^2 w(c) \text{sinc}(\tau_{acq}(\gamma c - \omega_0)) dc\,dx\,dy$$

If $\Delta\omega$ is small enough, then:

$$\overline{S}(0) \approx C \int_R \frac{\rho(x,y,\gamma^{-1}\omega_0) b_{rec1}(x,y,\gamma^{-1}\omega_0)}{\partial_z \phi_0(x,y,z(x,y,\gamma^{-1}\omega_0))} dx\,dy \tag{62}$$

Up to a scale factor, this is the total spin density along the slice $S_{\omega_0}$, weighted by $b_{rec1}/\partial_z \phi_0$.

The addition of gradients to resolve the 3-dimensional structure of $\rho$ is now considered. As in the previous section, a scheme may be used that directly samples a 3-dimensional Fourier transform. Because the direction of $B_0$ varies, one needs to consider the properties of the actual gradient fields, and not simply their projections along a fixed direction. For this discussion, it is supposed that one can generate gradient fields in the region D, which can be represented as linear combinations of two basic gradient fields denoted by $G_1$ and $G_2$. They are solutions, defined in a neighborhood of D, of the time independent, vacuum Maxwell equation.

As before, in order to do 3D-imaging in a straightforward manner we require two further assumptions about the gradient fields:

3. For all pairs $(\eta_1, \eta_2)$ satisfying $|\eta_j| \leq \eta_{max}$, $j=1,2$, one can generate the field $\eta_1 G_1 + \eta_2 G_2$.
4. For each $c \in [c_0, c_1]$, the map from R to a subset of the plane, defined by:

$$X = \frac{\langle G_1(x,y,z), B_0(x,y,z)\rangle}{\phi_0(x,y,z)} \quad (63)$$

$$Y = \frac{\langle G_2(x,y,z), B_0(x,y,z)\rangle}{\phi_0(x,y,z)} \quad (64)$$

is one-to-one and has a smooth inverse

In standard imaging, with a background field given by $B_0 = (0, 0, b_0)$, the basic gradient fields are modeled as $G_1 = (z, 0, x)$ and $G_2 = (0, z, y)$. It is well known that one can generate the linear combinations described in assumption 3 above. In this case $X=x$, $Y=y$, so both assumptions are easily seen to be satisfied.

It will be appreciated by those skilled in the art that due to the linear nature of Maxwell's equations, if, using electromagnets, one can generate the fields $G_1$ and $G_2$, in the region D, then, by adjusting the currents, one can also generate the linear combinations called for in assumption 1. In and of itself, condition 3 is a consequence of Maxwell's equation. It is also the fundamental requirement for obtaining data that can be interpreted as samples of the Fourier transform of a function simply related to $\rho$.

Assumption 4 is a bit harder to check in practice. If the direction of $B_0$ does not vary too much over the region D, then this condition is also easily satisfied. If $\{\tilde{x}, \tilde{y}, \tilde{z}\}$ is an orthonormal frame such that $B_0(0,0,0)$ is parallel to $\tilde{z}$, then it is easy to show that there are vacuum solutions of Maxwell's equations of the form:

$$G_1 = x\tilde{z} + a_1\tilde{x} + a_2\tilde{y} \quad G_2 = y\tilde{z} + a_2\tilde{x} + b_2\tilde{y}, \quad (65)$$

where $a_1, a_2, b_1, b_2$ are linear functions, vanishing at $(0,0,0)$. With these solutions:

$$X = x + h.o.t., \quad Y = y + h.o.t.,$$

here h.o.t. are terms vanishing quadratically at $(0,0,0)$. Hence, if the field-of-view is not too large, or, alternately, the direction of $B_0$ does not vary too rapidly, then the pair $(X,Y)$, defined by the fields given in equations (63) and (64), satisfies assumption 4.

How the expression for the signal is modified by the addition of the gradient fields may now be seen. It is assumed that $\phi_0$ is sufficiently large throughout the field of view so that one can ignore components of $G_1$ and $G_2$ orthogonal to $B_0$. Here a spatial encoding scheme is used like that described above. For each allowable pair $(\eta_1, \eta_2)$ there is an expression for the signal:

$$S_{(\eta_1,\eta_2)}(t) \approx \frac{C\omega_0^2}{\gamma} \int_{c_2} \int_{c_0}^{c_1} \frac{\rho(x,y,c)b_{1rec}(x,y,c)}{\partial_z \phi_0(x,y,z(x,y,c))} \quad (66)$$

$$gw(c)e^{i\gamma[c(t-\tau_3)+\eta_1 X(x,y,c)+\eta_2 Y(x,y,c)]}dcdxdy.$$

The time parameter is normalized so that the refocusing pulse ends at $t=0$, at which time, the gradient field $\eta_1 G_1 + \eta_2 G_2$ is switched on.

Using assumption 2, one can solve for $x(X,Y,c)$ and $y(X,Y,c)$ throughout the region of integration. Let $J(X,Y,c)$ denote the Jacobian of this change of variables: $dxdy = J(X, Y,c)dXdY$. The expression for the signal becomes:

$$S_{(\eta_1,\eta_2)}(t) \approx \frac{C\omega_0^2}{\gamma} \int_{c_0}^{c_1} \int_{c_2} \bar{\rho}(X,Y,c)w(c)e^{i\gamma[c(t-\tau_3)+\eta_1 X+\eta_2 Y]}dXdYdc. \quad (67)$$

where:

$$\bar{\rho}(X,Y,c) = \frac{\rho(x(X,Y,c), y(X,Y,c), c)b_{1rec}(x(X,Y,c), y(X,Y,c), c)}{\partial_z \phi_0(x(X,Y,c), y(X,Y,c), c)} J(X,Y,c) \quad (68)$$

Demodulating and sampling one can measure samples $F(w \bar{\rho})(k_j)$, where, as before, the points $\{k_j\}$ lie along straight lines within C. The normalization here is a little different from that used above. In the earlier case, with $B_0$ given by equation (7), is was not necessary to change variables in the "z-direction."

Up to a constant, the measured signal equals the ordinary Fourier transform of $w\bar{\rho}(X,Y,c)$. Using a variety of reconstruction techniques, based on the Fourier transform, such as regridding and filtered back-projection, one can therefore reconstruct $w\bar{\rho}(X,Y,c)$. To determine the original spin density requires a knowledge of $b_{1rec}$ and the transformations:

$$(x,y,z) \leftrightarrow (x,y,c) \leftrightarrow (X,Y,c). \quad (69)$$

These in turn can be computed with a knowledge of the background field $B_0$ and the basic gradient fields $G_1$ and $G_2$. The necessary coordinate transformations are determined by the fields $B_0$, $G_1$ and $G_2$, which means that they can be computed once and stored. But for the need to do this reparameterization before displaying the image, the computational requirements for imaging with an inhomogeneous field are comparable to those found in X-ray CT. Using the phase encoding-frequency encoding approach described above, with uniform sample spacing, one could use a standard FFT for the reconstruction step.

The conditions above on the background field and gradient fields are essentially that the functions:

$$\phi_0(x,y,z), \frac{\langle G_1(x,y,z), B_0(x,y,z)\rangle}{\phi_0(x,y,z)}, \quad (70)$$

$$\frac{\langle G_2(x,y,z), B_0(x,y,z)\rangle}{\phi_0(x,y,z)}$$

define a one-to-one map from the field-of-view to a set of the form $[c_0, c_1] \times R$, with R a subset of $i^2$. Implicitly, it is assumed that the direction of $B_0$ does not vary too much within D. This assumption is needed in order to apply the analysis of selective excitation with an inhomogeneous background field presented in the afore-mentioned Epstein paper. In this case, one also expects the receive coil sensitivity, $b_{rec1}$, to be approximately constant (or a least bounded from below) within D. Under these conditions it may be seen that the size of the measured signal obtainable with an inhomogeneous field should be comparable to the signal that can be obtained with a homogeneous field. Because there is always a large gradient, diffusion effects may also diminish the signal.

Analysis in the Non-Linear Case for the 2D Imaging Protocol

This section briefly describes the needed modifications, for the 2D-slice embodiment, if the gradient fields $G_0, G_1, G_2$ are not linear but satisfy the conditions enumerated above. For simplicity, we first describe how this approach would be applied to image a 2-dimensional object, so that the slices are 1-dimensional. The modifications needed to image 3-dimensional object with 2-dimensional slices is described at the end of this section. A 2D protocol is described using two refocusing pulses. In this case, $B_0=B_{00}+G_0$, where $B_{00}$ is the uniform field $B_{00}=(0,b_0)$. If G denotes an adjustable gradient field, then the local Larmor frequency is determined by:

$$|B_0 + G| = b_0 + \left\langle \frac{2B_{00} + G_0 + G}{2b_0}, G_0 + G \right\rangle + O\left(\frac{1}{b_0}\right) \tag{71}$$

This equation shows that the validity of the assumption that, for the purposes of analyzing the MR-signal, the gradient fields can be replaced by their projections onto $B_0$, is equivalent to the assumption that:

$$|G_0 + G| \ll b_0. \tag{72}$$

This assumption pertains throughout the calculations that follow.

Modifying the notation in the linear case, then:

$$g_0 = \left\langle \frac{B_{00}}{b_0}, G_0 \right\rangle, \quad g_1 = \left\langle \frac{B_{00}}{b_0}, G_1 \right\rangle. \tag{73}$$

The assumptions on the fields $G_0, G_1$ imply that $\nabla g_0, \nabla g_1$ are linearly independent at every point within the field of view.

As shown by Epstein in *Magnetic Resonance Imaging in Inhomogeneous Fields*, Inverse Problems, Vol. 20 (2004), pp. 753-780, provided the direction of $B_0$ does not vary too much within the field-of-view, the selective excitation step proceeds very much as in the linear case. After the sample becomes polarized in the background field $B_0$, one may turn on the field $G_1$ and expose the sample to a selective RF-pulse. If w(s) is the slice profile, then the magnetization at the conclusion of the $\alpha$-RF-pulse is:

$$m(0') = \sin \alpha \rho(x,z) w(\gamma(g_0+g_1)) e^{i \tau_0 \gamma(g_0+g_1)}. \tag{74}$$

The transverse component is non-zero in the non-linear region of space where:

$$w(\gamma(g_0(x,z)+g_1(x,z))) \neq 0. \tag{75}$$

After a refocusing pulse:

$$m(1') = \sin \alpha \rho(x,z) w(\gamma(g_0+g_1)) e^{-i \tau_0 \gamma(g_0+g_1)}. \tag{76}$$

The field $G_1$ is turned off and the magnetization is allowed to freely precess for $2\tau_0$ time units and is once refocused giving:

$$m(2') = \sin \alpha \rho(x,z) w(\gamma(g_0+g_1)) e^{-i \tau_0 \gamma(g_0-g_1)}. \tag{77}$$

Finally, at $t=0$, the field $-G_1$ is again turned on to obtain the measured signal:

$$S(t) = \int_D \sin \alpha \rho(x,z) w(\gamma(g_0+g_1)) e^{i(t-\tau_0)\gamma(g_0-g_1)} dx dz. \tag{78}$$

Now using the basic assumptions, which imply that:

$$gA = g_0 + g_1 \quad gB = g_0 - g_1 \tag{79}$$

define coordinates throughout the region of space occupied by the object, D, and define a map onto a region D' of $R^2$ topologically equivalent to a square. Let $dxdz = g^2 J(A,B) dA dB$, the coefficient j is used to normalize so that $g^2 J \approx 1$ near the "center" of the slice. The signal equation becomes:

$$S(t) = g^2 \int_D \sin \alpha \rho(x(A,B), z(A,B)) \tag{80}$$
$$w(\gamma g A) e^{i(t-\tau_0)\gamma g B} J(A,B) dA dB.$$

For each fixed B, A a (x(A, B), z(A, B)) traces a smooth curve in the xz-plane which is, in some sense, transverse to the slice. This is, of course, just the curve:

$$g^{-1}(g_0(x,z) - g_1(x,z)) = B.$$

Rewrite the signal as a 1-dimensional Fourier transform of the slice averaged function:

$$\bar{\rho}(B) = g^2 \int \rho(x(A,B), z(A,B)) w(\gamma g A) J(A,B) dA \tag{81}$$

provides:

$$S(t) = \sin \alpha \int_D \bar{\rho}(B) e^{i(t-\tau_0)\gamma g B} dB. \tag{82}$$

The measurements are then samples of the Fourier transform of $\rho$. Samples of $\rho$ can be reconstructed as a function of B. To reconstruct $\rho$ in the slice defined $-\Delta f \leq g^{-1} \gamma(g_0 + g_1) \leq \Delta f$, one only needs to invert the relations in equation (79) to solve for (x,z) as functions of (A,B). Using the computation of J(A,B) one can also rescale the data according to the density of the individual slices. These steps are possible, at least numerically, if one knows the functions $g_0(x,z), g_1(x,z)$.

For concreteness the example is considered where $g_0 = z^2$, $g_1 = x^2$. The functions A,B define coordinates in the half plane x>0: $A = z^2 + x^2, g_1 = z^2 - x^2$. The image of the positive quadrant is the region where A>|B|. The area forms are related by the equation:

$$dx dz = \frac{dA dB}{2\sqrt{A^2 - B^2}}. \tag{83}$$

Figure 11:
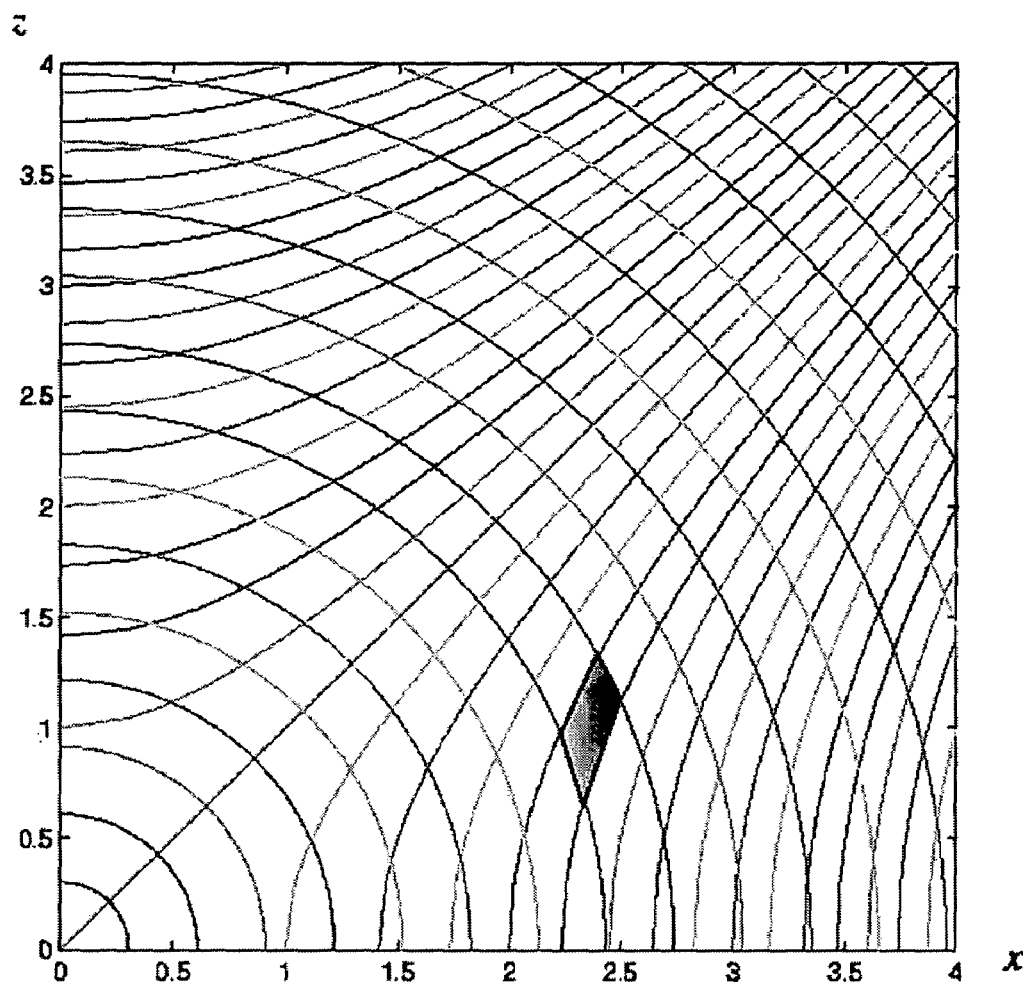
FIG. 11 illustrates level sets of G0+G1 (circular arcs) and G0−G1 (hyperbolas), where a slice is a region between two circular arcs and the slice averaging is along the hyperbolas.

FIG. 11 shows level lines of A and B in this quadrant. As illustrated, near to x=z the pixels are nearly rectilinear, but are less so near the axes. A typical pixel is shaded. The function ρ is given by:

$$\rho(B) = \int_{-\Delta f}^{\Delta f} w(\gamma A) \rho\left(\sqrt{\frac{A-B}{2}}, \sqrt{\frac{A+B}{2}}\right) \frac{dA}{2\sqrt{A^2 - B^2}}. \quad (84)$$

From examination of FIG. 11, it is evident that the simple notions of pixel and resolution, which are used with linear gradients, are not especially meaningful in the strongly non-linear case. Indeed it is evident that resolution in the reconstructed image, when transformed back to physical coordinates, is unlikely to be either isotropic at most points in the image plane, or homogeneous across the image.

Adding a third dimension is straightforward, given that one can generate two adjustable gradients $G_1, G_2$ so that the projections in the $B_0$-direction, $g_0, g_1, g_2$, define a smooth invertible mapping from the field of view to a region in $R^3$ topologically equivalent to a cube. A field of the form $G_0 + g_s G_1$ can be used for slice selection, multiples of $G_2$ can be used to phase encode, and $G_0 - g_s G_1$ can be used as a read-out gradient. As explained in the afore-mentioned Epstein article, the measurements obtained in this way can be interpreted, after a change of physical (x-space) coordinates, as the Fourier transform of non-linear averages, of non-linear 2-dimensional slices of $\rho(x,y,z)$.

An advantage of the 2D approach of the invention is that it allows the usage of a magnet with a substantial permanent gradient to be used as the main magnet in an MR-imaging device. This is accomplished without significantly sacrificing either resolution, acquisition time or SNR. By using slanted slices one recovers, in almost its entirety, the formalism used to describe imaging with a homogeneous background field. In particular, one can use a simple FFT to reconstruct the image, along with a post-processing step to remove geometric distortions due to either non-linear gradient fields or to the slant slice acquisition. The method of the invention produces high quality images, with acquisition times comparable to what would be used in a standard imaging device.

The inventors have quantified the inherent limitations of the method as regards SNR and resolution, and neither seems, in any way insuperable. As noted above, given a constant physical slice thickness, a large permanent gradient increases the noise in each acquired line in exactly inverse proportion to the time required to acquire the line. Hence, by refocusing and remeasuring these lines, one can recover all the lost SNR, without any increase in overall repeat time. If $g_x \ll g_z$, then, for a given measurement time, this approach does have an intrinsically lower resolution than a standard imaging method, with a homogeneous background field. The only real constraint on the applicability of this method is that ν not be too small, which allows for an enormous increase in the latitude available to designers of practical, high resolution, time and SAR efficient MR-imaging systems.

This technique could be used to build a "one-sided" 3d MR-imaging system as shown generally in FIG. 15, wherein the sample (patient) would lie on a patient table 100 to one side of the magnet 110. This could be used for open MR-systems, or specialized MR-systems, for example dental MR. In many of these applications, gradient and RF-coils 120 are situated near to or around the sample, which is itself placed to one side of the static field generating magnet 110.

As illustrated in FIG. 15, the gradient coils are controlled by gradient amplifier and controller 130, while the RF coils are connected to RF transmitter/receiver 140, which provides output to computer 150 for processing of the image data for display on display device 160. In this configuration, one would not need to work against nature to design magnets with a very homogeneous field "outside the bore," but can solve the easier problems associated with designing magnets that have fields with a moderate but smooth permanent gradient, which the approach of the invention uses to good advantage. One can even imagine how this technique could be applied to advantage in an application like well-logging. While direct inversion of the measurements leads to images with geometric distortion, this distortion is completely determined by the field gradients. For a given magnet and gradient set, the geometric transformations, needed to remove the distortion, could be computed once and stored.

Fields with Local Minima

If one could create a magnetic field, $B_0$ such that $|B_0(x, y, z)|$ assumes an isolated nonzero minimum value, then one could measure localized spectroscopic data using a single RF-pulse. Suppose the minimum occurs at $(x_0, y_0, z_0)$ and $\omega_0 = \gamma \phi_0(x_0, y_0, z_0)$. A selective excitation which excites frequencies in the band $[\omega_0 - \Delta\omega, \omega_0 + \Delta\omega]$ would only excite spins in the region of space bounded by the closed surface:

$$S_{\omega_0 + \Delta\omega} = \{(x,y,z) : \gamma \phi_0(x,y,z) = \omega_0 + \Delta\omega\}.$$

The entire FID is then produced by spins lying in a bounded region of space, close to the critical point of $\phi_0$. Examples of such fields will now be provided. These fields are obtained as perturbations of a uniform background field:

$$B_0 = [0, 0, b_0].$$

For real parameters $\epsilon$ and $\delta$:

$$B_{0,\epsilon\delta} = B_0 + \epsilon[x, -y, 0] + \delta[-2xz, 0, (z^2 - x^2)] \quad (85)$$

It is an elementary computation to see that:

$$\nabla \times B_{0,\epsilon\delta} = 0, \nabla \cdot B_{0,\epsilon\delta} = 0$$

and therefore these vector fields define vacuum solutions of Maxwell's equations. The length of $B_{0,\epsilon\delta}$ may be computed as:

$$|B_{0,\epsilon\delta}|^2 = b_0^2 + (\epsilon^2 - 2b_0\delta)x^2 + \epsilon^2 y^2 + 2b_0\delta z^2 - 4\epsilon\delta x^2 z + \delta^2(x^2 + z^2)^2 \quad (86)$$

The function $\phi_0$ equals the square root of $|B_{0,\epsilon\delta}|^2$, and therefore:

$$\nabla \phi_0 = \frac{\nabla |B_{0,\epsilon\delta}|^2}{2|B_{0,\epsilon\delta}|}.$$

The critical points of $\phi_0$, where $\phi_0$ does not vanish, therefore agree with the critical points of $|B_{0,\epsilon\delta}|^2$. At critical points, where $\phi_0 \neq 0$, the Hessian matrices satisfy:

$$H_{\phi_0} = \frac{H_{|B_{0,\epsilon\delta}|^2}}{2|B_{0,\epsilon\delta}|} \quad (87)$$

This shows that the types of the critical points agree as well.

From equation (86), it is clear that $\phi_0$ has critical point at (0,0,0). The Hessian is a diagonal matrix:

$$H_{\phi_0}(0,0,0) = \frac{2}{\phi_0(0,0,0)} \begin{pmatrix} \varepsilon^2 - 2b_0\delta & 0 & 0 \\ 0 & \varepsilon^2 & 0 \\ 0 & 0 & 2b_0\delta \end{pmatrix} \quad (88)$$

This demonstrates the following result:

If $\delta b_0 > 0$ and $\varepsilon^2 > 2\delta b_0$, then $B_{0,\varepsilon\delta}$ is a vacuum solution of Maxwell's equations such that $B_{0,\varepsilon\delta}$ has an isolated minimum at (0,0,0).

Figure 6:
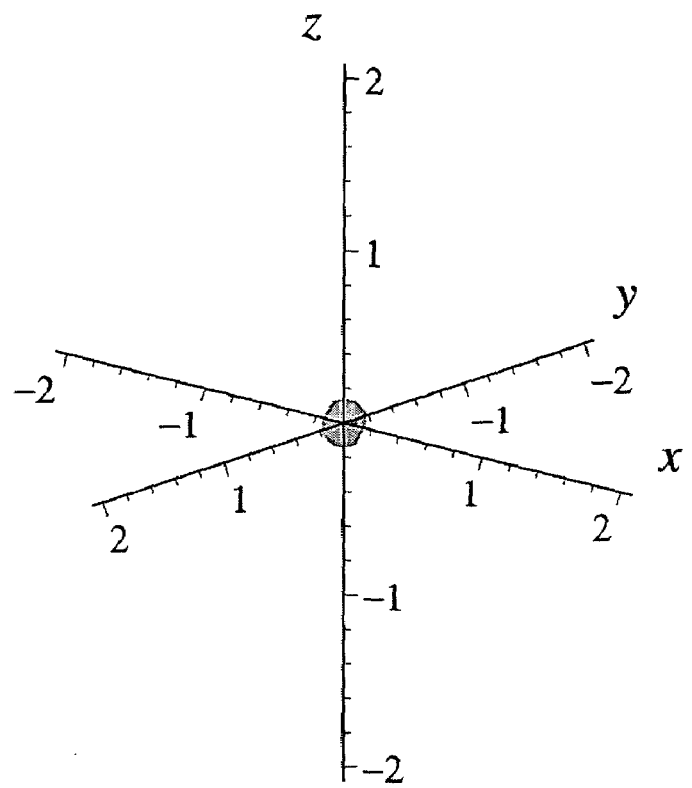
FIGS. 6(a) and 6(b) respectively illustrate two level surfaces of $B_{0,\epsilon\delta}$ with $b_0=1$, $\epsilon=0.1$, $\delta=0.0025$.
Figure 6:
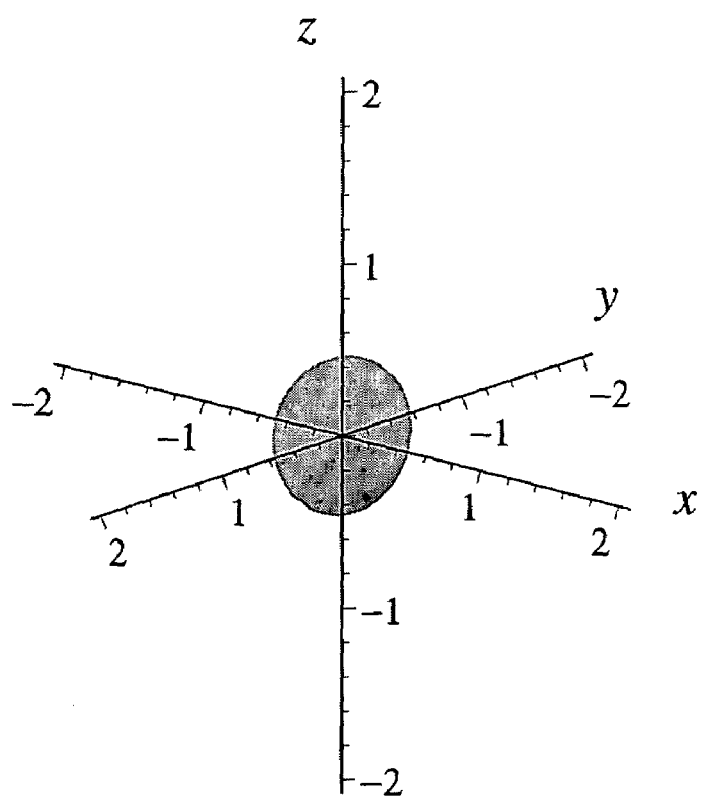

The fields $[x,-y,0]$ and $[-2xz,0,z^2-x^2]$ are essentially standard gradient fields. Therefore $B_{0,\varepsilon\delta}$ could be generated by using an arrangement of gradient coils within a standard homogeneous, high field magnet. FIG. 6 illustrates 2 level surfaces of $B_{0,\varepsilon\delta}$ with $b_0=1$, $\varepsilon=0.1$, $\delta=0.0025$.

SUMMARY

It has been shown how a magnet producing an inhomogeneous field, without critical points, can be used to produce the background field for an MR-imaging system. In particular, the present invention illustrates that the main difficulty that one encounters with a inhomogeneous background field is that of refocusing the phase that accumulates along the direction of $\nabla |B_0|$. Several methods for directly sampling the 3d-Fourier transform of $\rho$, or the 2d-Fourier transform of slices of $\rho$ are outlined.

Simple geometric criteria are provided for the MR measurements made, using an inhomogeneous background field and nonlinear gradients, to be samples of the Fourier transform, up to a single change of coordinates. This coordinate change is determined by the background field, $B_0$ and the basic gradient fields, $G_1, G_2$. As such it need only be computed once and stored. The computations strongly suggest that it should be possible to obtain a strong signal with a background field having substantial inhomogeneity.

By analyzing well-known imaging methods which employ fields with sweet spots, it may be shown that the principle underlying this approach is nothing other than the classical principle of stationary phase. In the prior art, these sweets spots are of saddle type. The aforementioned paper of Epstein provides a simple geometric explanation for the difficulty of obtaining localized information with critical points of this type: When the signal is large, the excited volume of space is seen to be highly non-localized. Hence, it is only in the long time limit, when the signal has largely decayed, that spatially localized information is available. Examples of fields are constructed such that $|B_0|$ has an isolated, nonzero local minimum. Using such a field one can obtain a well localized excitation, ab initio, thereby avoiding the most serious pitfall of earlier approaches to imaging with a sweet spot.

In the paper of Epstein cited above, the inventor shows that an isolated non-zero, local minimum is not possible under various symmetry hypotheses. For translationally invariant fields, it may be seen that local minima can occur, which, due to the translational invariance, must occur along a line. It is shown in the Epstein paper that an axially symmetric field cannot have an isolated minimum. Again, because of the axial symmetry, such an isolated minimum would have to occur along the axis of symmetry.

While the present invention has been described in connection with the preferred embodiments of the various figures, it is to be understood that other similar embodiments may be used or modifications and additions may be made to the described embodiment for performing the same function of the present invention without deviating therefrom. Those skilled in the art will appreciate that there may be limits on magnetic field inhomogeneity and the geometry of level sets near a critical point. There also may be limitations on RF-pulses in inhomogeneous fields as well as for critical points in fields with symmetry. Such limitations are described in the Epstein paper incorporated by reference above. Therefore, the present invention should not be limited to any single embodiment, but rather should be construed in breadth and scope in accordance with the appended claims.

What is claimed:

1. A method of magnetic resonance imaging an object in the presence of a permanent background gradient, $G_0$, in the polarizing field, $B_0$, comprising:
    selecting a 2-dimensional slice of the object for excitation that is not perpendicular to $G_0$;
    exciting the selected 2-dimensional slice of the object by applying a selective RF-pulse in the presence of a slice selection gradient $G_{ss}$, where $G_{ss}$ is a linear combination of $G_0$ and a transverse gradient $G_{ss}^{app}$, generated as a linear combination of basic gradient fields $G_1, G_2$ provided by a magnetic resonance scanner;
    applying a readout gradient $G_{re}$ where $G_{re}$ is a linear combination of $G_0$ and a transverse gradient $G_{re}^{app}$ generated as a linear combination of $G_1, G_2$, where $G_{ss}$ and $G_{re}$ are not parallel at any point in the selected excited slice; and
    reconstructing the selected excited slice of the object.

2. A method as in claim 1, further comprising phase encoding the selected excited slice with a gradient $G_{ph}$ generated as a linear combination of $G_1, G_2$.

3. A method as in claim 1, wherein the functions $X=(G_1, B_0)$, $Y=(G_2, B_0)$ and $Z=|B_0(x,y,z)|$, define local coordinates that map the field of view of the magnetic resonance scanner onto a region of space.

4. A method as in claim 3, wherein $G_{ss}=B_0+G_1$ and $G_{re}=B_0-G_1$.

5. A method as in claim 1, wherein the step of applying the readout gradient $G_{re}$ further comprises applying at least one refocusing pulse.

6. A magnetic resonance imaging device that images an object in the presence of a permanent background gradient, $G_0$, in the polarizing field, $B_0$, comprising:
    a magnetic resonance scanner that provides basic gradient fields $G_1, G_2$;
    an RF generator and RF coils that excite a selected 2-dimensional slice of the object for excitation that is not perpendicular to $G_0$ by applying a selective RF-pulse in the presence of a slice selection gradient $G_{ss}$, where $G_{ss}$ is a linear combination of $G_0$ and a transverse gradient $G_{ss}^{app}$, generated as a linear combination of the basic gradient fields $G_1, G_2$ provided by the magnetic resonance scanner;
    a gradient generator and gradient coils that apply a readout gradient $G_{re}$ where $G_{re}$ is a linear combination of $G_0$ and a transverse gradient $G_{re}^{app}$ generated as a linear combination of $G_1, G_2$, where $G_{ss}$ and $G_{re}$ are not parallel at any point in the selected excited slice; and
    a processor that reconstructs the selected excited slice of the object.

7. A device as in claim 6, further comprising means for phase encoding the selected excited slice with a gradient $G_{ph}$ generated as a linear combination of $G_1, G_2$.

8. A device as in claim 6, wherein the functions $X=(G_1, B_0)$, $Y=(G_2, B_0)$ and $Z=\|B_0(x,y,z)\|$, where $G_0=\Delta B_0$, define local coordinates that map the field of view of the magnetic resonance scanner onto a region of space.

9. A device as in claim 8, wherein $G_{ss}=B_0+G_1$ and $G_{re}=B_0-G_1$.

10. A device as in claim 6, wherein the gradient generator applies the readout gradient $G_{re}$ by applying at least one refocusing pulse.

* * * * *

UNITED STATES PATENT AND TRADEMARK OFFICE
CERTIFICATE OF CORRECTION

PATENT NO. : 7,309,986 B2
APPLICATION NO. : 11/385338
DATED : December 18, 2007
INVENTOR(S) : Charles L. Epstein et al.

It is certified that error appears in the above-identified patent and that said Letters Patent is hereby corrected as shown below:

Column 6,
Line 63, delete " $B_0 = B_{00} + <(x,y,z),(g_x,g_y,g_z)>$ " and insert -- $B_0 = B_{00} + \langle (x,y,z),(g_x,g_y,g_z) \rangle$ --.

Line 65, delete " $<(x,y,z),(g_x,g_y,g_z)>$ " and insert

-- $\langle (x,y,z),(g_x,g_y,g_z) \rangle$ --.

Column 11,
Line 18, delete " $B_{fe0} = <(g_x,g_y,0),(x,y,z)> \hat{z}$ " and insert -- $B_{fe0} = \langle (g_x,g_y,0),(x,y,z) \rangle \hat{z}$ --.

Column 14,
Line 30, delete "$\rho_1 G_1 + \rho_2 G_2$" and insert -- $\eta_1 G_1 + \eta_2 G_2$ --.

Line 60, delete " $S(t) = \int_D \sin \alpha \rho \left( \frac{g_z b - g_x a}{g}, y, \frac{g_z b - g_x b}{g} \right)$ " and insert -- $S(t) = \int_D \sin \alpha \rho \left( \frac{g_z b - g_x a}{g}, y, \frac{g_z a + g_x b}{g} \right)$ --.

UNITED STATES PATENT AND TRADEMARK OFFICE
CERTIFICATE OF CORRECTION

PATENT NO. : 7,309,986 B2
APPLICATION NO. : 11/385338
DATED : December 18, 2007
INVENTOR(S) : Charles L. Epstein et al.

It is certified that error appears in the above-identified patent and that said Letters Patent is hereby corrected as shown below:

Column 15,
Lines 11-13, delete

" $$\overline{\rho}(a,y) = \frac{g^2}{2g_x g_z} \int \rho\left(\frac{(s-a)}{2g_x}, y, \frac{g(s+a)}{2g_z}\right) w(g\gamma s) ds$$ " and insert -- $$\overline{\rho}(a,y) = \frac{g^2}{2g_x g_z} \int \rho\left(\frac{g(s-a)}{2g_x}, y, \frac{g(s+a)}{2g_z}\right) w(g\gamma s) ds$$ --

Column 19,
Line 22, delete "ithout" and insert -- Without --.

Column 21,
Line 13, delete "|η$_j$|≦η$_{max}$,J=1,2," and insert -- |η$_j$|≦η$_{max}$,j=1,2, --.

UNITED STATES PATENT AND TRADEMARK OFFICE
CERTIFICATE OF CORRECTION

PATENT NO. : 7,309,986 B2
APPLICATION NO. : 11/385338
DATED : December 18, 2007
INVENTOR(S) : Charles L. Epstein et al.

It is certified that error appears in the above-identified patent and that said Letters Patent is hereby corrected as shown below:

Column 22,
Lines 1-7, delete

" $$S(\eta_1+\eta_2)(t) \approx \frac{C\omega_0^2}{\gamma} \int_{o2}\int_{c_0}^{c_1} \frac{\rho(x,y,c)b_{1rec}(x,y,c)}{\partial_z\phi_0(x,y,z(x,y,c))} gw(c)e^{i\gamma[c(t-\tau 3)+i\eta 1 X(x,y,c)+i\eta 2Y(x,y,c)]}dcdxdy.$$ " and insert -- $$S_{(\eta_1,\eta_2)}(t) \approx \frac{C\omega_0^2}{\gamma} \int_{-2}\int_{c_0}^{c_1} \frac{\rho(x,y,c)b_{1rec}(x,y,c)}{\partial_z\phi_0(x,y,z(x,y,c))} g\, w(c)e^{i\gamma[c(t-\tau_3)+i\eta_1 X(x,y,c)+i\eta_2 Y(x,y,c)]}dcdxdy.$$ --.

Line 34, delete "is" and insert -- it --.

Signed and Sealed this

Fifth Day of August, 2008

JON W. DUDAS
*Director of the United States Patent and Trademark Office*